(12) United States Patent
Goto et al.

(10) Patent No.: US 12,483,221 B2
(45) Date of Patent: Nov. 25, 2025

(54) MULTILAYER PIEZOELECTRIC SUBSTRATE DEVICE WITH PARTIALLY RECESSED PASSIVATION LAYER

(71) Applicant: SKYWORKS SOLUTIONS, INC., Irvine, CA (US)

(72) Inventors: Rei Goto, Osaka (JP); Hironori Fukuhara, Ibaraki (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 473 days.

(21) Appl. No.: 17/810,866

(22) Filed: Jul. 6, 2022

(65) Prior Publication Data
US 2023/0016884 A1 Jan. 19, 2023

Related U.S. Application Data

(60) Provisional application No. 63/222,051, filed on Jul. 15, 2021.

(51) Int. Cl.
*H03H 9/145* (2006.01)
*H03H 3/08* (2006.01)
*H03H 9/02* (2006.01)
*H03H 9/64* (2006.01)

(52) U.S. Cl.
CPC .............. *H03H 9/145* (2013.01); *H03H 3/08* (2013.01); *H03H 9/02543* (2013.01); *H03H 9/6483* (2013.01)

(58) Field of Classification Search
CPC .. H03H 9/145; H03H 9/02543; H03H 9/6483; H03H 9/02992; H03H 9/1457; H03H 9/02574; H03H 3/08

USPC ................................................... 333/193–196
See application file for complete search history.

(56) References Cited

U.S. PATENT DOCUMENTS

| | | | |
|---|---|---|---|
| 9,065,424 B2 * | 6/2015 | Nakanishi | H03H 9/02992 |
| 9,136,458 B2 * | 9/2015 | Komatsu | H10N 30/87 |
| 9,257,960 B2 * | 2/2016 | Ruile | H03H 9/1457 |
| 9,374,062 B2 * | 6/2016 | Iwamoto | H03H 9/725 |
| 9,413,330 B2 * | 8/2016 | Shimizu | H03H 9/02992 |
| 9,640,750 B2 | 5/2017 | Nakanishi et al. | |
| 9,673,779 B2 * | 6/2017 | Ruile | H03H 9/1457 |

(Continued)

FOREIGN PATENT DOCUMENTS

| | | | |
|---|---|---|---|
| CN | 113098432 A * | 7/2021 | H03H 9/145 |
| FR | 3105894 A1 * | 7/2021 | H03H 3/08 |
| JP | 2020092422 A * | 6/2020 | H03H 9/02228 |

*Primary Examiner* — Jorge L Salazar, Jr.
(74) *Attorney, Agent, or Firm* — Lando & Anastasi, LLP

(57) ABSTRACT

A surface acoustic wave resonator comprises a multi-layer piezoelectric substrate including a carrier substrate, a layer of a first dielectric material disposed on the carrier substrate, and a layer of piezoelectric material disposed on the layer of the first dielectric material, interdigital transducer electrodes disposed on the layer of piezoelectric material and including interleaved electrode fingers, and a layer of a second dielectric material disposed on a central interleaved region of the interleaved electrode fingers, gap regions of the interdigital transducer electrodes being either free of the layer of the second dielectric material or having a thinner layer of the second dielectric material than the central interleaved region to reduce spurious signals in an admittance curve of the surface acoustic wave resonator.

23 Claims, 44 Drawing Sheets

(56) References Cited

U.S. PATENT DOCUMENTS

| | | | |
|---|---|---|---|
| 9,748,924 B2* | 8/2017 | Komatsu | H10N 30/87 |
| 10,361,678 B2 | 7/2019 | Iwaki et al. | |
| 10,574,207 B2* | 2/2020 | Yoon | H03H 9/02858 |
| 11,239,817 B2 | 2/2022 | Hatano et al. | |
| 2014/0285287 A1 | 9/2014 | Komatsu et al. | |
| 2017/0214385 A1* | 7/2017 | Bhattacharjee | H03H 3/0072 |
| 2020/0021266 A1* | 1/2020 | Swamy | H03H 9/25 |
| 2020/0067482 A1* | 2/2020 | Maki | H03H 9/145 |
| 2020/0144984 A1* | 5/2020 | Fukuhara | H03H 9/145 |
| 2020/0212875 A1* | 7/2020 | Goto | H03H 9/54 |
| 2020/0212876 A1* | 7/2020 | Goto | H03H 9/173 |
| 2020/0212883 A1* | 7/2020 | Goto | H03H 9/54 |
| 2021/0006225 A1* | 1/2021 | Hatano | H03H 9/6436 |
| 2021/0167748 A1* | 6/2021 | Huck | H03H 9/02574 |
| 2022/0247377 A1 | 8/2022 | Hayashi | |
| 2023/0327630 A1 | 10/2023 | Goto et al. | |
| 2023/0327642 A1 | 10/2023 | Goto et al. | |
| 2023/0327645 A1 | 10/2023 | Goto et al. | |
| 2023/0402989 A1 | 12/2023 | Merker et al. | |
| 2023/0402991 A1 | 12/2023 | Nishimura | |
| 2024/0039508 A1 | 2/2024 | Zheng et al. | |

\* cited by examiner

MULTILAYER PIEZOELECTRIC SUBSTRATE DEVICE WITH PARTIALLY RECESSED PASSIVATION LAYER

CROSS-REFERENCE TO RELATED APPLICATIONS

This application claims priority under 35 U.S.C. § 119(e) to U.S. Provisional Patent Application Ser. No. 63/222,051, titled "MULTILAYER PIEZOELECTRIC SUBSTRATE DEVICE WITH PARTIALLY RECESSED PASSIVATION LAYER," filed Jul. 15, 2021, the entire contents of which is incorporated herein by reference for all purposes.

BACKGROUND

Technical Field

Embodiments of this disclosure relate to acoustic wave devices and filters and to methods and structures for reducing spurious signals in the admittance curves of same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front end of a mobile telephone can include acoustic wave filters. Two acoustic wave filters can be arranged as a duplexer or a diplexer.

SUMMARY

In accordance with one aspect, there is provided a surface acoustic wave resonator. The surface acoustic wave resonator comprises a multi-layer piezoelectric substrate including a carrier substrate, a layer of a first dielectric material disposed on the carrier substrate, and a layer of piezoelectric material disposed on the layer of the first dielectric material, interdigital transducer electrodes disposed on the layer of piezoelectric material and including interleaved electrode fingers, and a layer of a second dielectric material disposed on a central interleaved region of the interleaved electrode fingers, gap regions of the interdigital transducer electrodes being either free of the layer of the second dielectric material or having a thinner layer of the second dielectric material than the central interleaved region to reduce spurious signals in an admittance curve of the surface acoustic wave resonator.

In some embodiments, the first dielectric material comprises silicon dioxide.

In some embodiments, second dielectric material exhibits a higher acoustic velocity than the first dielectric material.

In some embodiments, the second dielectric material comprises silicon nitride.

In some embodiments, the interleaved electrode fingers include tip regions that are free of the layer of the second dielectric material.

In some embodiments, the interleaved electrode fingers include tip regions, and both the gap regions and the tip regions have the thinner layer of the second dielectric material disposed thereon.

In some embodiments, the interdigital transducer electrodes include busbars that are covered by one of the layer of the second dielectric material or the thinner layer of the second dielectric material.

In some embodiments, the interdigital transducer electrodes include mini-busbar electrodes disposed within the gap regions.

In some embodiments, the mini-busbar electrodes extend continuously across a plurality of electrode fingers.

In some embodiments, the mini-busbar electrodes a broken into a plurality of segments, each of the plurality of segments connected to a single electrode finger.

In some embodiments, the interleaved electrode fingers include tip regions having a greater duty factor than a duty factor of the interleaved electrode fingers within the central interleaved region.

In some embodiments, the layer of the second dielectric material disposed on the central interleaved region of the interleaved electrode fingers has a thickness of about $0.01\lambda$.

In some embodiments, the interdigital transducer electrodes include dummy electrode fingers disposed within the gap regions.

In some embodiments, the interleaved electrode fingers have a duty factor greater than 0.5.

In some embodiments, the surface acoustic wave resonator further comprises a layer of the first dielectric material disposed between the interdigital transducer electrodes and the layer of the second dielectric material.

In some embodiments, the surface acoustic wave resonator further comprises a layer of a third dielectric material disposed on a top of the layer of the second dielectric material, the third dielectric material being different from the first dielectric material and from the second dielectric material.

In some embodiments, the surface acoustic wave resonator is included in a filter.

In some embodiments, the filter is included in a radio frequency device module.

In some embodiments, the radio frequency device module is included in a radio frequency device.

In accordance with another aspect, there is provided a method of forming a surface acoustic wave resonator. The method comprises forming interdigital transducer electrodes on a multi-layer piezoelectric substrate including a carrier substrate, a layer of a first dielectric material disposed on a front side of the carrier substrate, and a layer of piezoelectric material disposed on a front side of the layer of the first dielectric material, and forming a layer of a second dielectric material on a central interleaved region of the interleaved electrode fingers, gap regions of the interdigital transducer electrodes being either free of the layer of the second dielectric material or having a thinner layer of the second dielectric material than the central interleaved region to reduce spurious signals in an admittance curve of the surface acoustic wave resonator.

In some embodiments, the method further comprises forming a radio frequency filter including the surface acoustic wave resonator.

In some embodiments, the method further comprises forming a radio frequency device module including the radio frequency filter.

In some embodiments, the method further comprises forming a radio frequency electronic device including the radio frequency device module.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
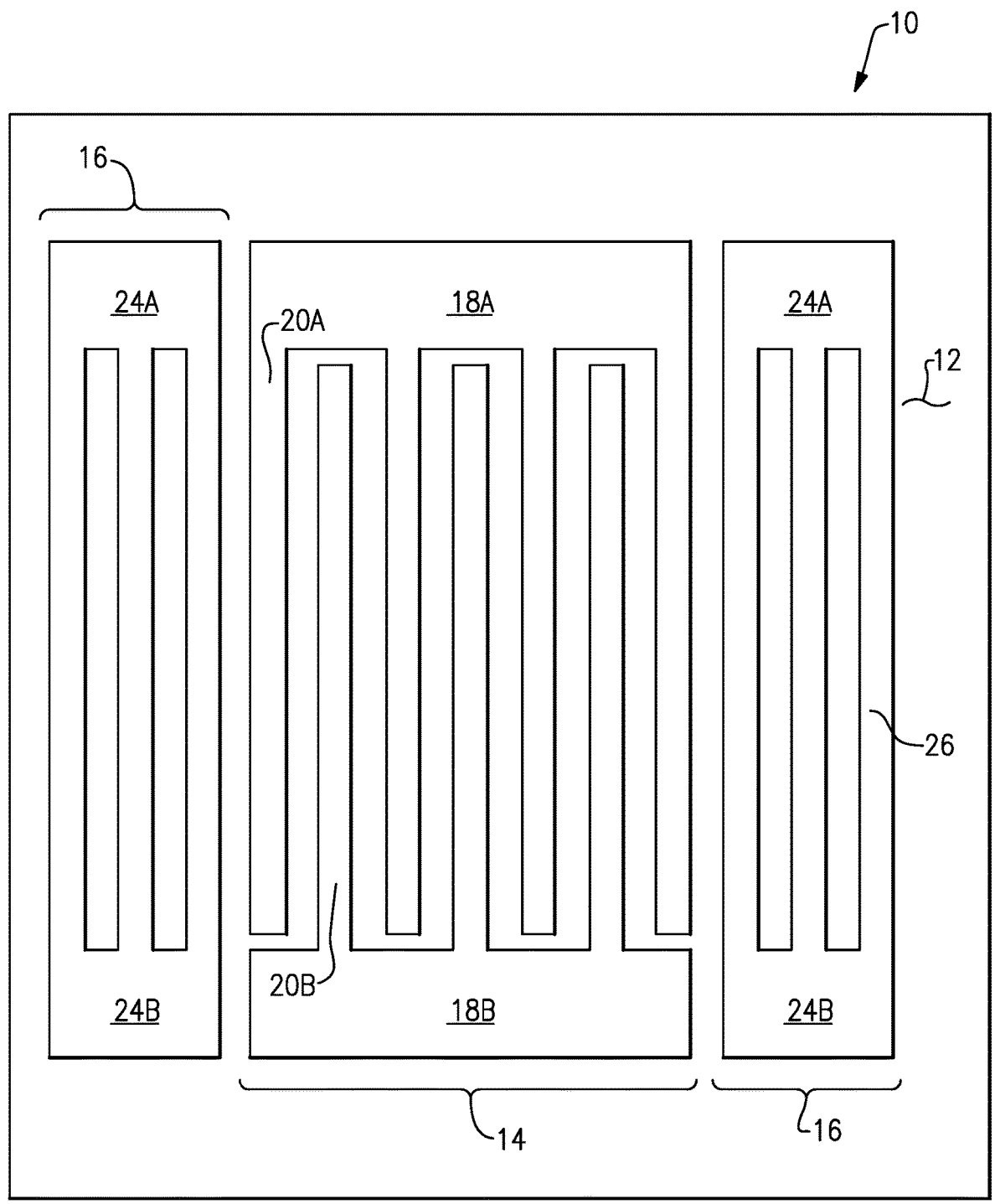
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, diplexer, balun, etc.

Acoustic wave resonator 10 is formed on a piezoelectric substrate, for example, a lithium tantalate (LiTaO$_3$) or lithium niobate (LiNbO$_3$) substrate 12 and includes interdigital transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first busbar electrode 18A and a second busbar electrode 18B facing first busbar electrode 18A. The busbar electrodes 18A, 18B may be referred to herein together as busbar electrode 18. The IDT electrodes 14 further include first electrode fingers 20A extending from the first busbar electrode 18A toward the second busbar electrode 18B, and second electrode fingers 20B extending from the second busbar electrode 18B toward the first busbar electrode 18A.

The reflector electrodes 16 (also referred to as reflector gratings) each include a first reflector busbar electrode 24A and a second reflector busbar electrode 24B (collectively referred to herein as reflector busbar electrode 24) and reflector fingers 26 extending between and electrically coupling the first busbar electrode 24A and the second busbar electrode 24B.

Figure 1B:
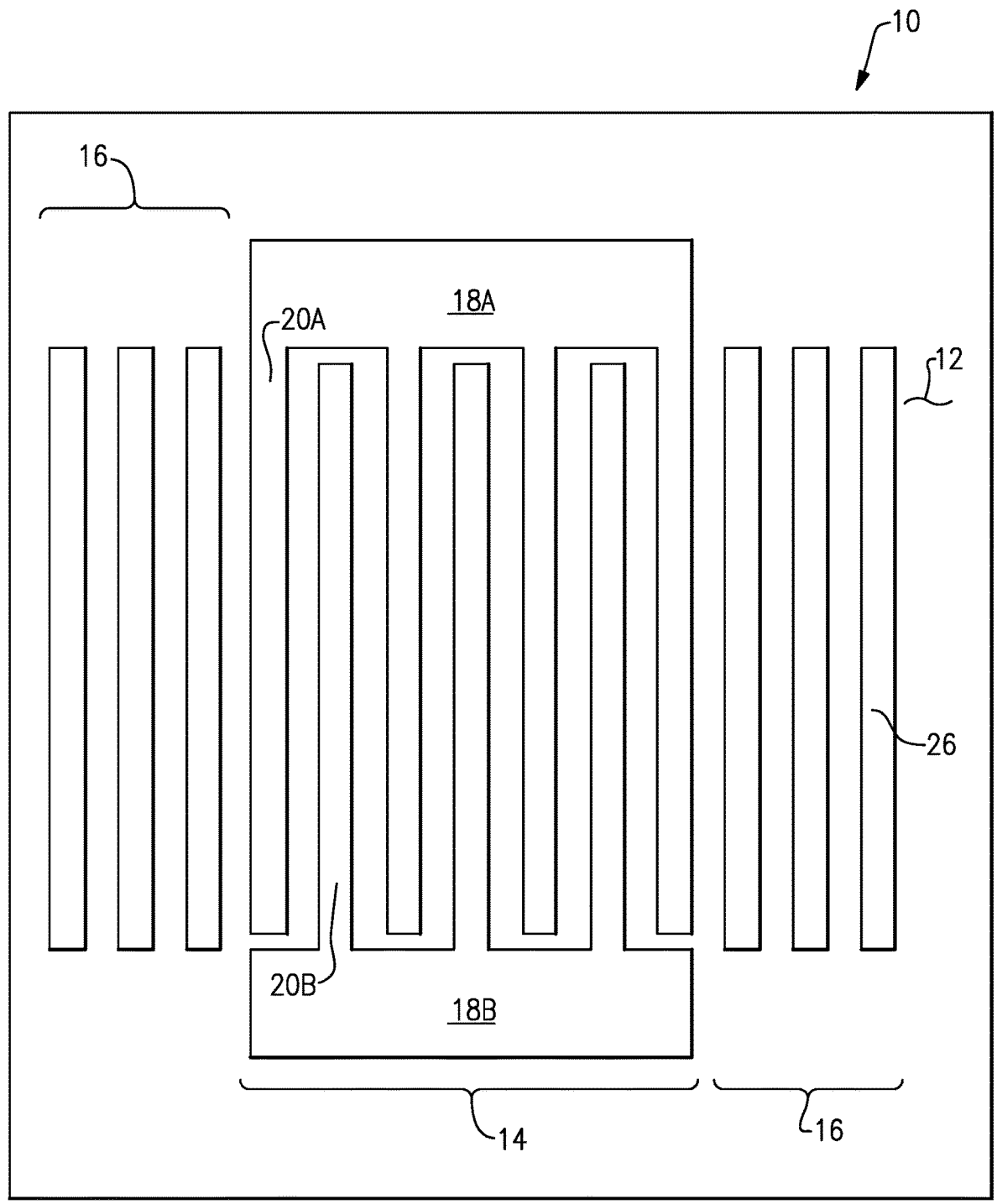
FIG. 1B is a simplified plan view of another example of a surface acoustic wave resonator.
Figure 1C:
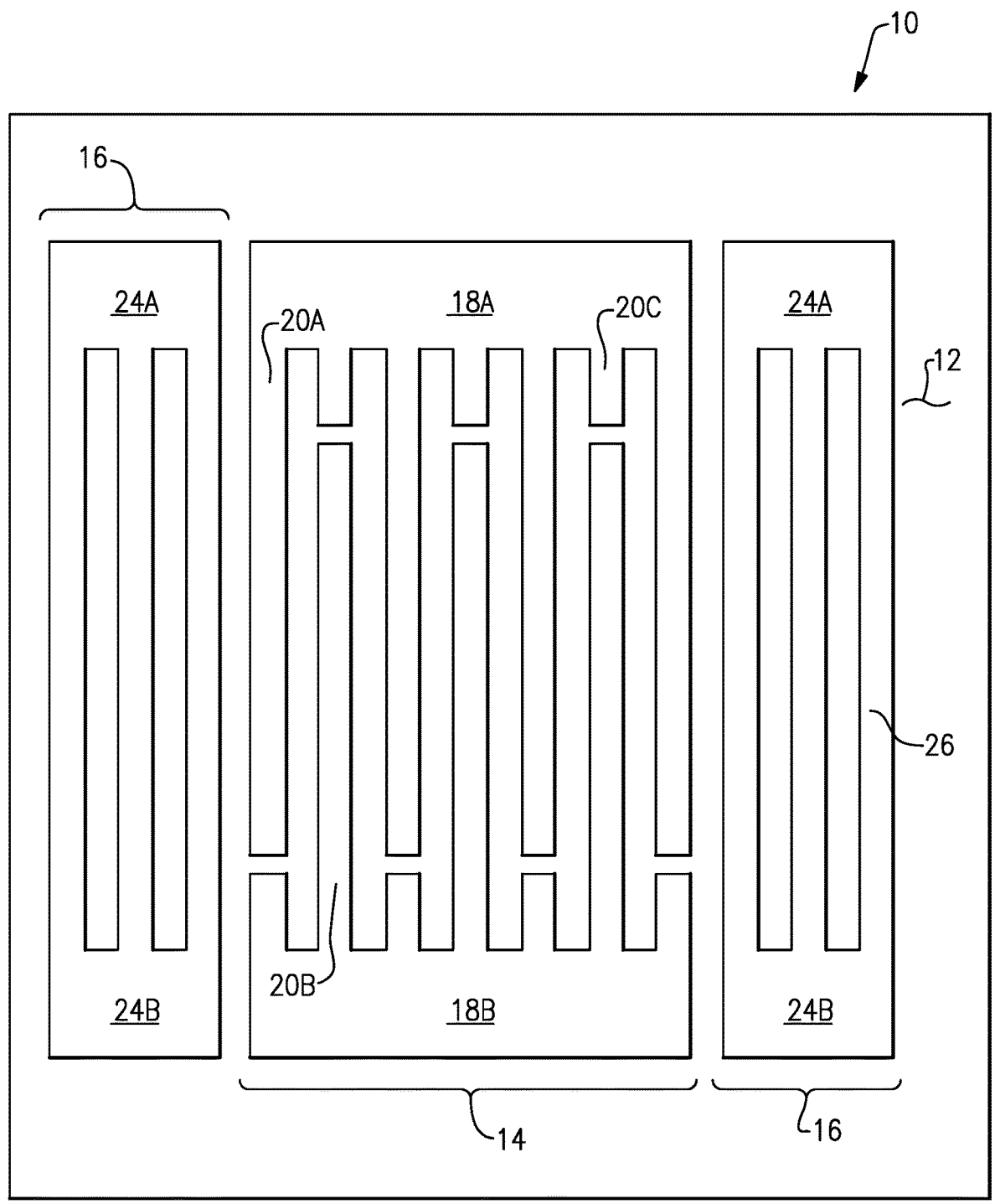
FIG. 1C is a simplified plan view of another example of a surface acoustic wave resonator.

In other embodiments disclosed herein, as illustrated in FIG. 1B, the reflector busbar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite busbar electrode 18A, 18B than the respective electrode finger 20A, 20B with which it is aligned.

Figure 2A:
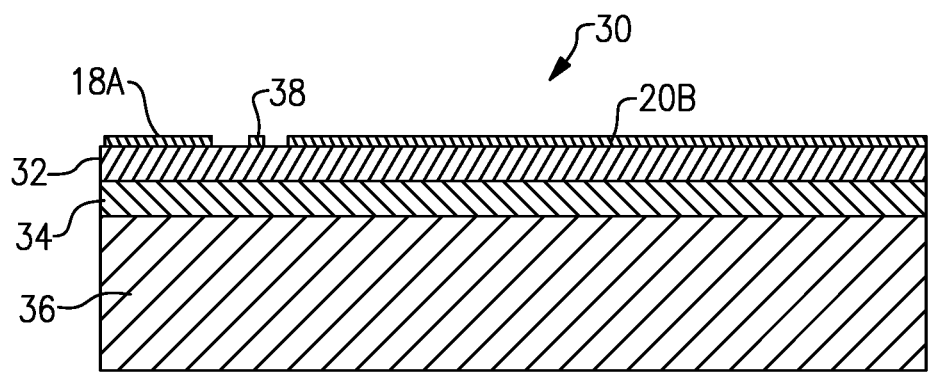
FIG. 2A is a cross-sectional view of a portion of a surface acoustic wave resonator having a multi-layer piezoelectric substrate.

FIG. 2A is a partial cross-sectional view of an acoustic wave resonator 30 having a multilayer piezoelectric substrate including a layer 32 of piezoelectric material, for example, lithium tantalate or lithium niobate, a dielectric material layer 34, for example, silicon dioxide, on which the layer 32 of piezoelectric material is disposed, and a carrier substrate 36 on which the dielectric material layer 34 is disposed. The carrier substrate 36 may be formed of, for example, silicon or a dielectric material, for example, silicon dioxide, aluminum oxide, or sapphire. The carrier substrate 36 is typically thicker than the layer 32 of piezoelectric material and the dielectric material layer 34 and provides the acoustic wave resonator 30 with increased mechanical strength. In some embodiments, the layer 32 of piezoelectric material and the dielectric material layer 34 may each be between about 0.1λ and about 0.5λ thick, λ being the wavelength of an acoustic wave at the resonant frequency of the resonator.

Figure 2B:
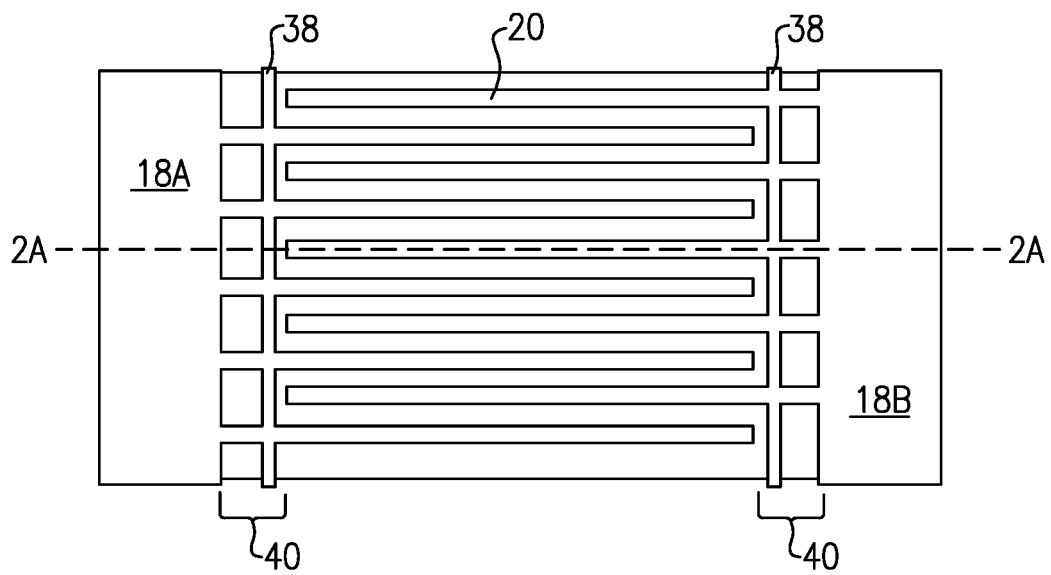
FIG. 2B is a plan view of the interdigital transducer (IDT) electrode structure of the surface acoustic wave resonator of FIG. 2A.

FIG. 2B is a plan view of the acoustic wave resonator 30 of FIG. 2A. The cross-sectional view of FIG. 2A is through line 2A-2A of FIG. 2B. In addition to including IDT electrode fingers 20 and busbar electrodes 18A, 18B like the acoustic wave resonators of FIGS. 1A-1C, the acoustic wave resonator 30 includes mini-busbar electrodes 38 (also referred to herein as mini-busbars) connecting the IDT electrode fingers proximate the portions of the IDT electrode fingers attached to the busbar electrode 18A, 18B from which they extend. The min-busbar electrodes are disposed in gap regions 40 between tips of the IDT electrode fingers extending from one busbar electrode 18A, 18B and the opposite busbar electrode 18A, 18B. It is to be understood that a resonator including the structure shown in FIGS. 2A and 2B, as well as the other resonator structures illustrated herein would also include reflector electrodes (not shown). The resonator structure shown in FIGS. 2A and 2B is referred to as the reference structure (REF) herein.

Figure 3:
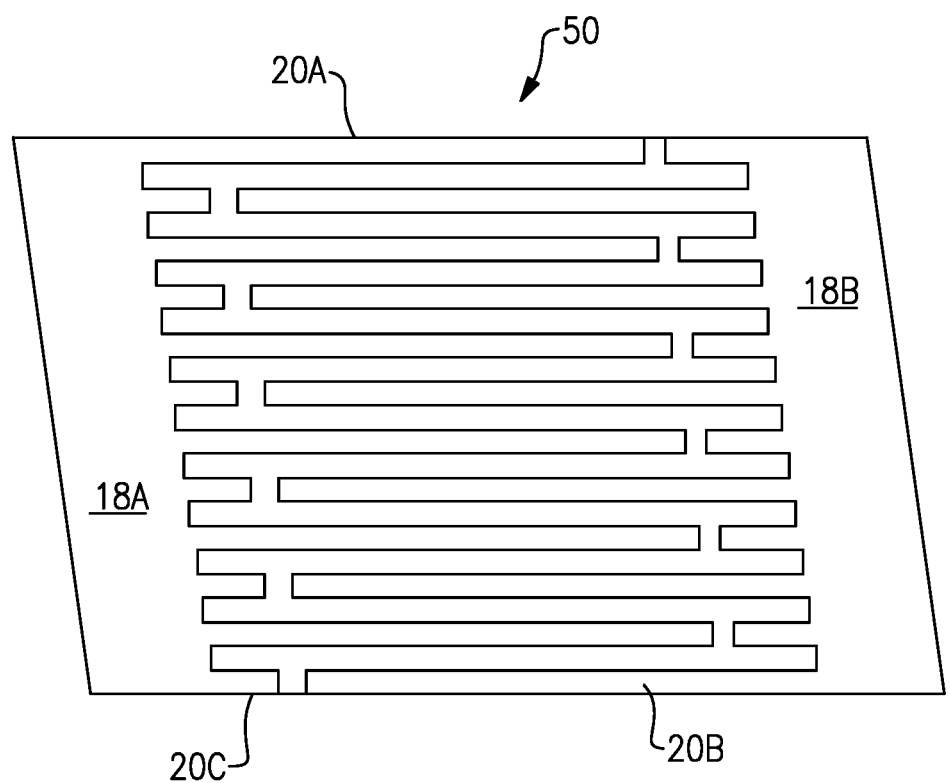
FIG. 3 illustrates a plan view of the IDT electrode structure of a surface acoustic wave resonator with a tilted orientation.

FIG. 3 illustrates a plan view of the IDT structure of a surface acoustic wave resonator 50 with a tilted or slanted orientation. The surface acoustic wave resonator includes busbar electrodes 18A, 18B, electrode fingers 20A, 20B extending from the respective busbar electrodes 18, 18B, and dummy electrode fingers 20C. The busbar electrodes 18A, 18B are tilted or slanted from an angle normal to the extension direction of the electrode fingers 20A, 20B. A slanted IDT such as illustrated in FIG. 3 was proposed to suppress spurious signals in the admittance curve of the resonator between the resonant and anti-resonant frequencies caused by transverse mode acoustic waves. However, an unwanted spurious signal response above the anti-resonant frequency of the resonator was observed that causes degradation in response characteristics of filters formed from such resonators. The resonator structure shown in FIG. 3 is referred to as the "Slanted" structure herein.

Figure 4A:
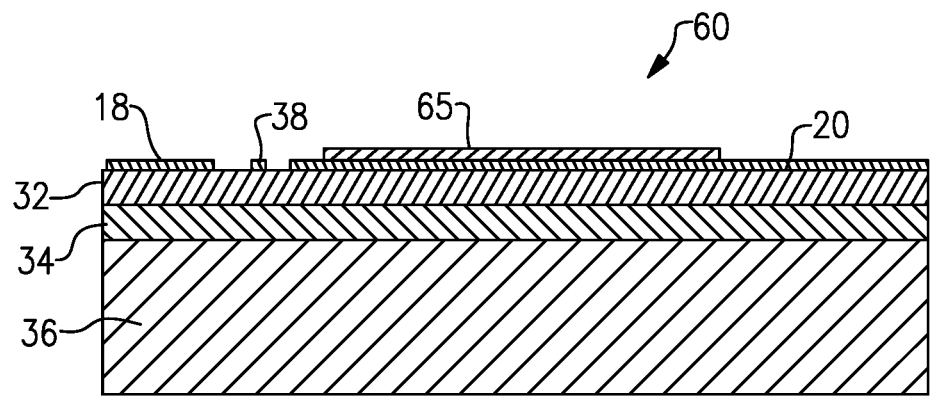
FIG. 4A is a cross-sectional view of a portion of a surface acoustic wave resonator having a multi-layer piezoelectric substrate and passivation layer over portions of the IDT electrode.
Figure 4B:
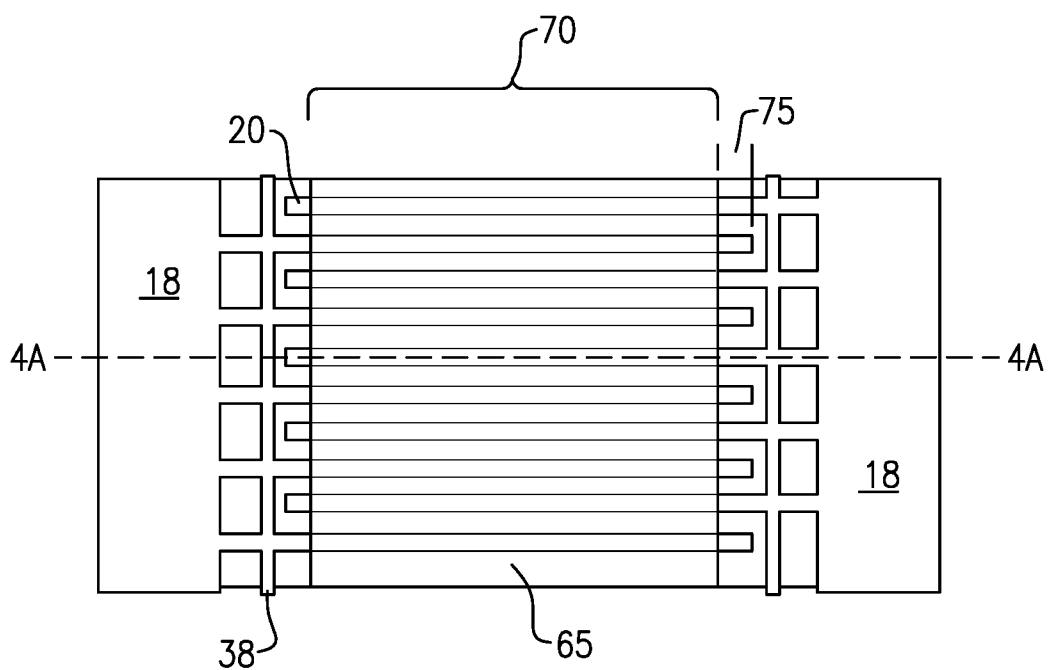
FIG. 4B is a plan view of the surface acoustic wave resonator of FIG. 4A.

FIGS. 4A and 4B illustrate a partial cross-sectional view and plan view, respectively, of a surface acoustic wave resonator configuration 60 similar to that illustrated in FIGS. 2A and 2B but including a layer of dielectric material 65, for example, silicon nitride ($Si_3N_4$ or SiN) disposed on a central interleaved region 70 of the IDT electrode fingers 20. Tip regions 75 of the IDT electrode fingers 20 may be uncovered by the layer of dielectric material 65. The tip regions 75 may be, for example, between about 0.3λ and about 1.5λ across, or about 1λ across. The resonator structure shown in FIGS. 4A and 4B is referred to as the "SiN passivation trench" structure herein.

Figure 5A:
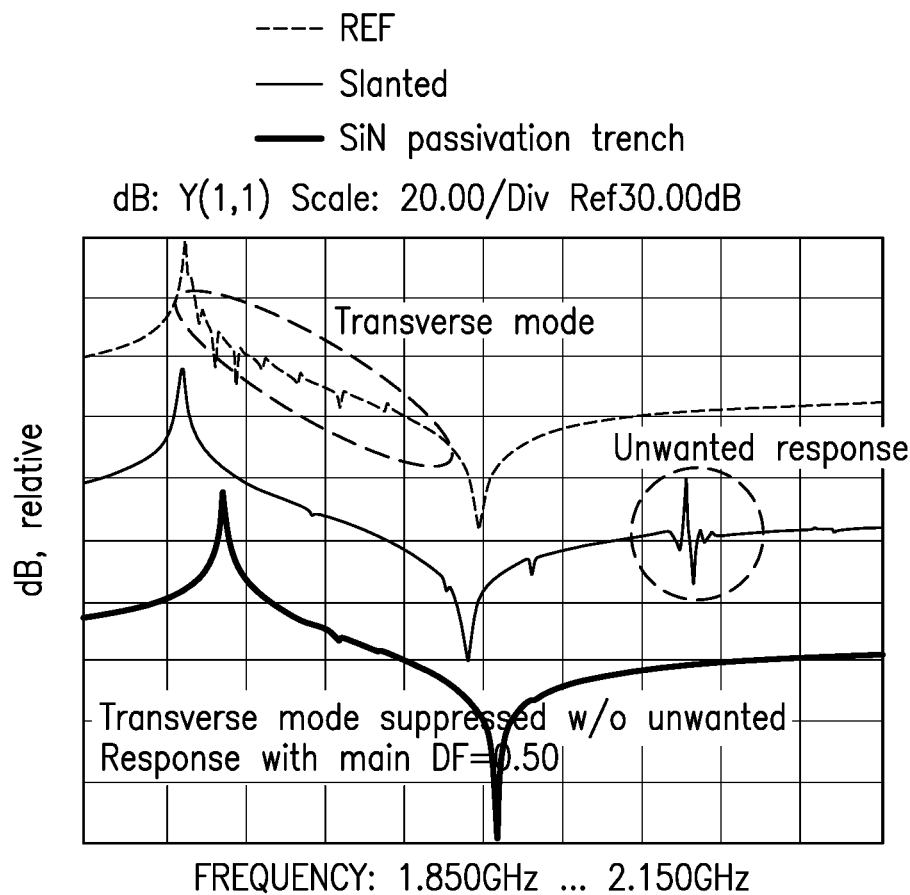
FIG. 5A is a chart comparing admittance versus frequency for resonators having the IDT electrode structures of FIGS. 2A-4B.
Figure 5B:
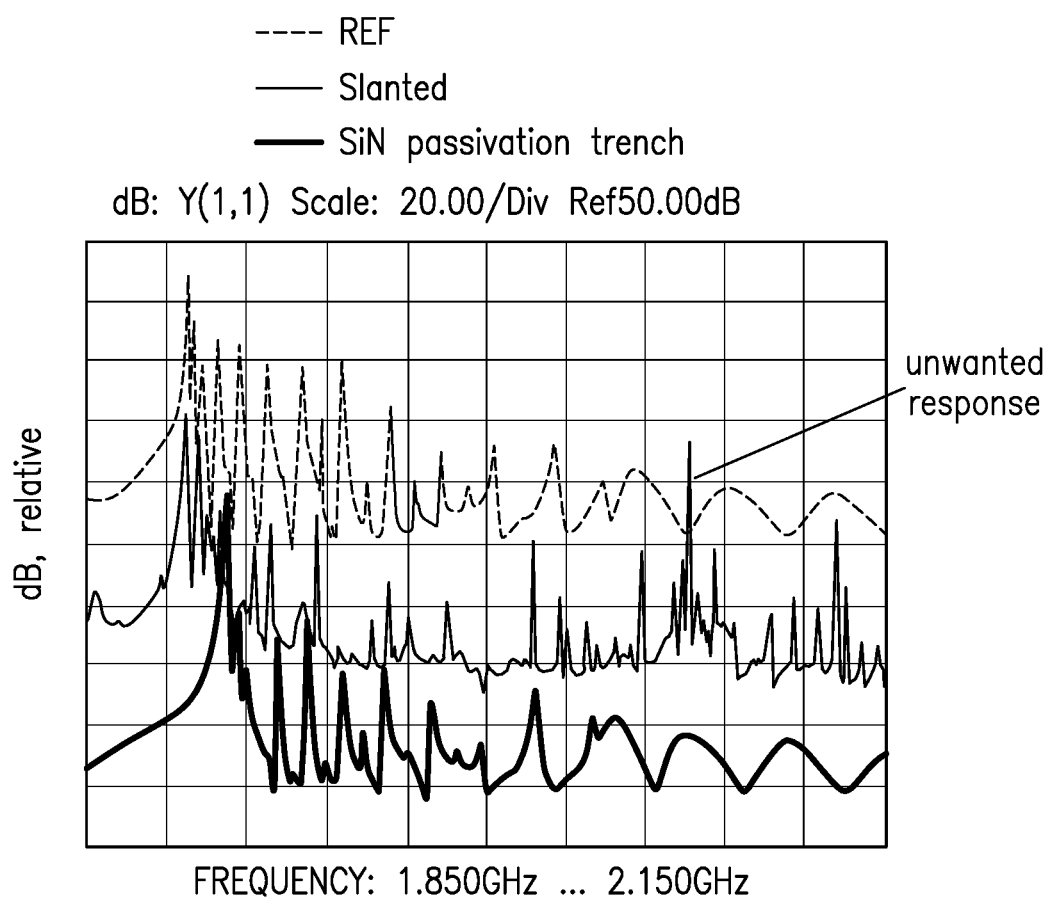
FIG. 5B is a chart comparing real admittance versus frequency for resonators having the IDT electrode structures of FIGS. 2A-4B.

FIGS. 5A and 5B are charts comparing admittance versus frequency and the real part of admittance versus frequency, respectively, for resonators having the IDT structures in FIGS. 2A-4B. Each of the resonator structures were simulated with aluminum IDTs having a thickness of 0.08λ, a lithium tantalate piezoelectric film having a thickness of 0.2λ, a silicon dioxide film having a thickness of 0.2λ, and a duty factor (DF) of the IDT electrode fingers in the interleaved area of 0.5. The thickness of the silicon nitride film on the simulated resonator having the SiN passivation trench structure was 0.01λ. In FIGS. 5A and 5B, the different curves are vertically offset for illustration, but this is not indicative of different absolute levels of the admittance parameters. This is also the case for other charts of admittance characteristics presented herein.

As can be seen in FIG. 5A, the REF resonator structure exhibits discontinuities in the admittance curve between the resonant and anti-resonant frequency due to transverse mode acoustic waves. These discontinuities are also represented by the high amount of noise in the real admittance curve for the REF resonator structure above the resonant frequency as shown in FIG. 5B. The Slanted resonator structure exhibits an unwanted response in the admittance curves above the antiresonance frequency that is illustrated in both FIG. 5A and FIG. 5B. The SiN passivation trench resonator structure exhibits an admittance curve in which the transverse mode discontinuities are suppressed and without the unwanted response exhibited by the Slanted resonator structure.

Figure 6A:
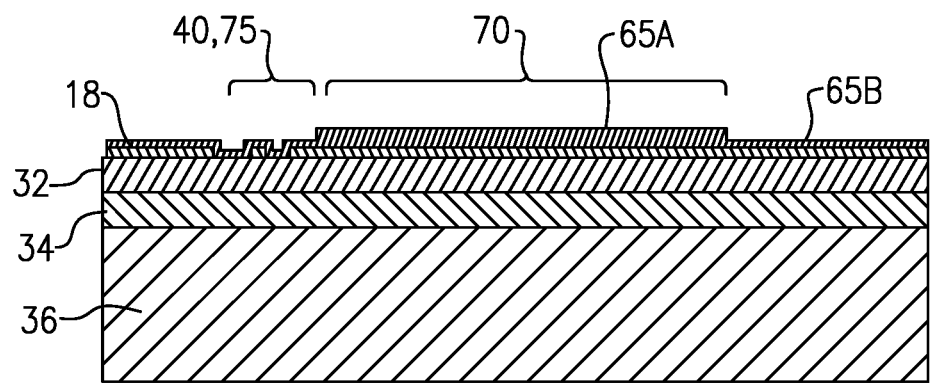
FIG. 6A is a cross-sectional view of a portion of another surface acoustic wave resonator.
Figure 6B:
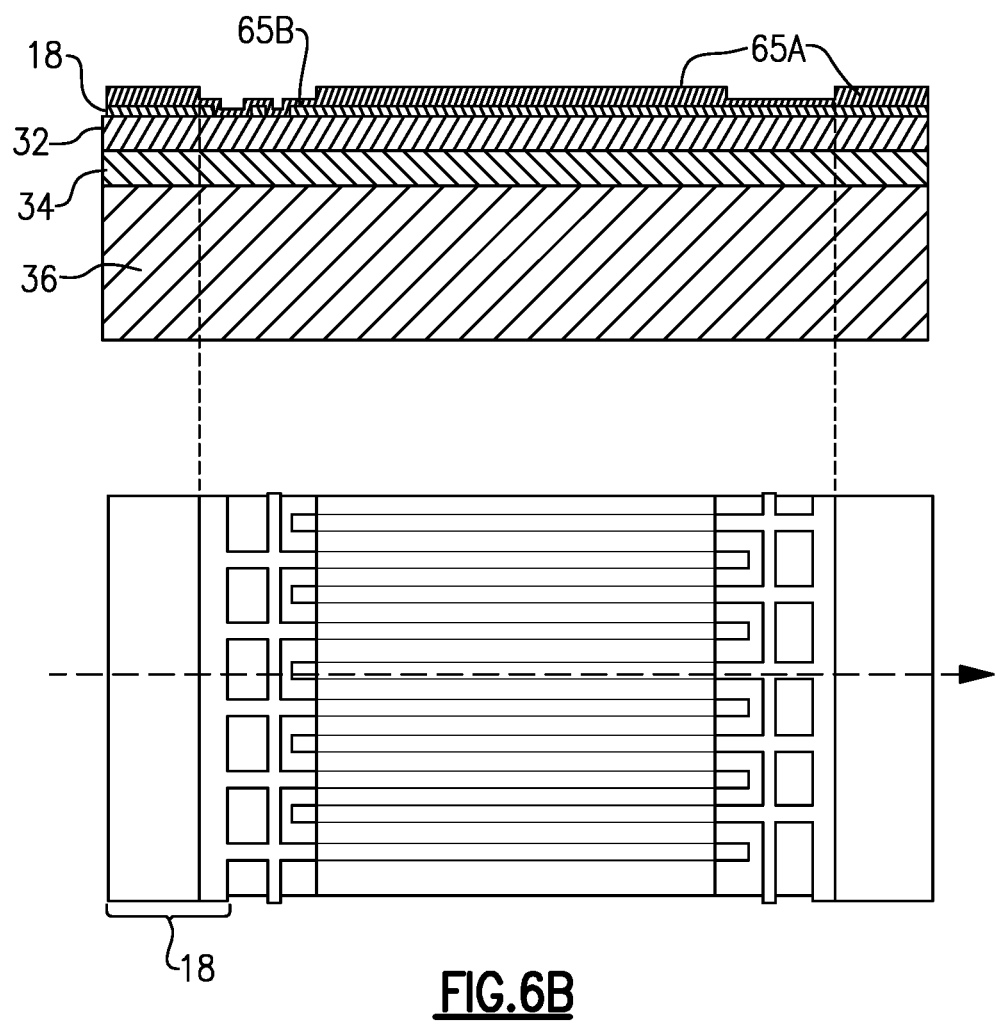
FIG. 6B is a cross-sectional view and the corresponding plan view of a portion of another surface acoustic wave resonator.
Figure 6C:
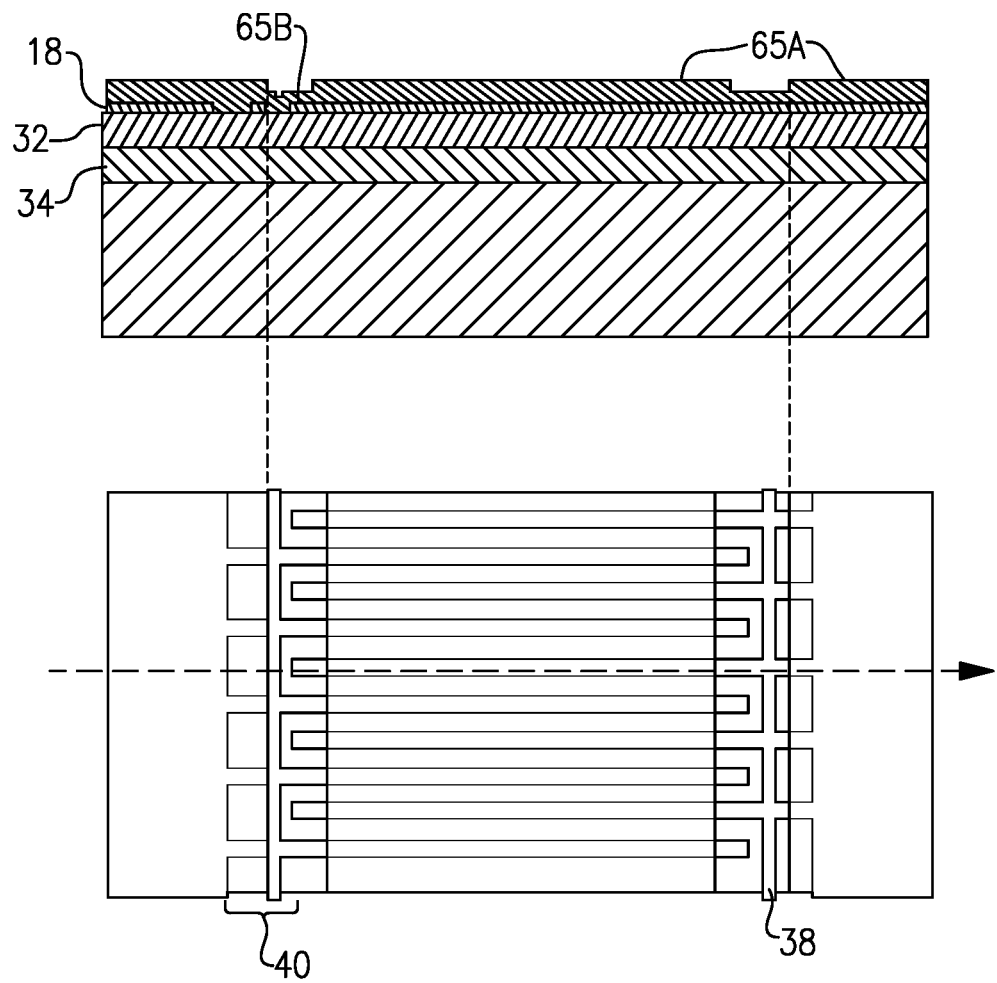
FIG. 6C is a cross-sectional view and the corresponding plan view of a portion of another surface acoustic wave resonator.
Figure 6D:
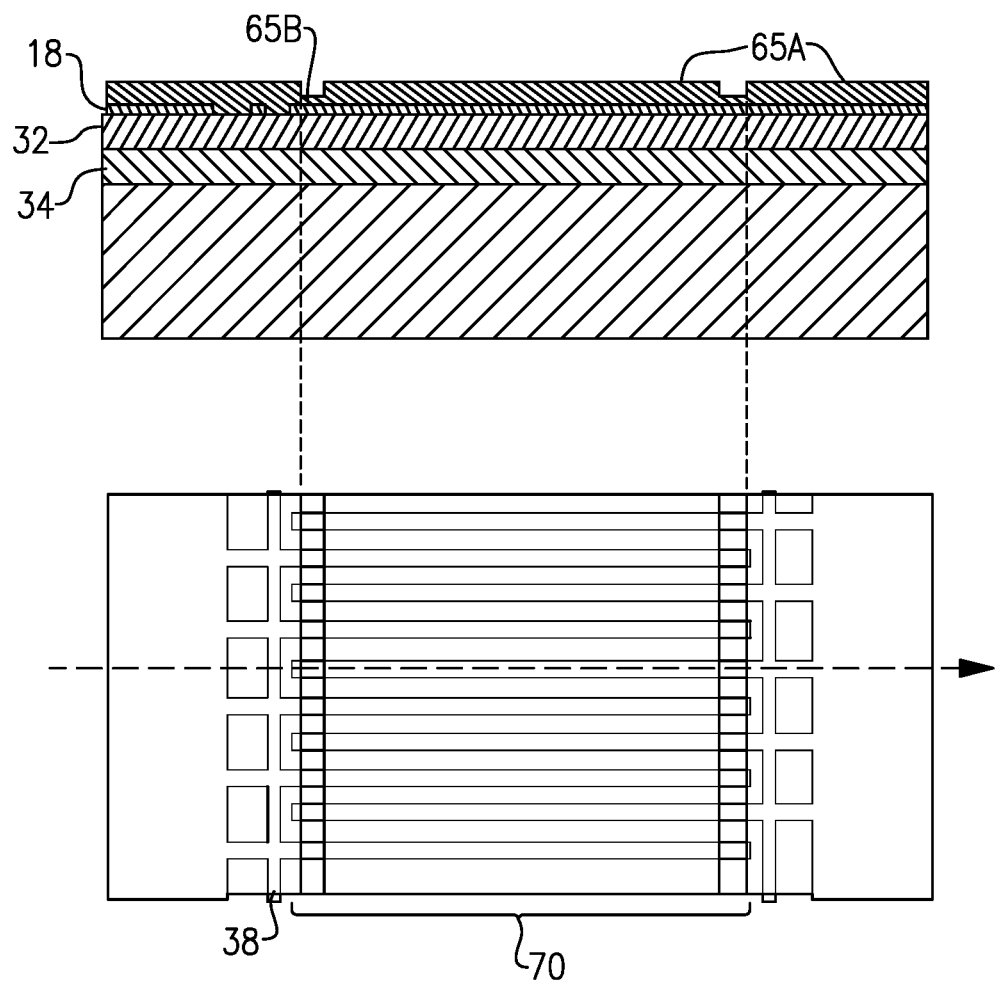
FIG. 6D is a cross-sectional view and the corresponding plan view of a portion of another surface acoustic wave resonator.

In modifications to the surface acoustic wave resonator configuration 60 of FIGS. 4A and 4B, a layer of silicon nitride may be present on portions of the structure outside of the central interleaved region 70. As illustrated in FIG. 6A, a thicker silicon nitride film 65A may be present in the central interleaved region 70 while a thinner silicon nitride film 65B is present over the remaining structures, including in the gap and tip regions 40, 75 and over the mini-busbar electrodes 38 and busbar electrodes 18. In some embodiments, the thicker silicon nitride film 65A may have a thickness of between about 10 nm and about 150 nm. The thinner silicon nitride film 65B, when present, may have a thickness of between 40 nm and 80 nm less than the thickness of the thicker silicon nitride film 65A. This thickness difference may be dependent on the width of the tip regions 75. The difference in thickness between the thicker silicon nitride film and the thinner silicon nitride film 65B may be between 40 nm and 80 nm for a structure with a tip width of 1λ, but a thickness difference of between 80 nm and 160 nm may be more appropriate for a structure with a tip width of 0.5λ. As illustrated in FIG. 6B, the thicker silicon nitride film 65A may be present in the central interleaved region 70 as well as over a portion or all of the busbar electrodes 18, and the thinner silicon nitride film 65B may be present in the gap and tip regions. In another embodiment, illustrated in FIG. 6C, the outer boundary of the thinner silicon nitride film 65B may be within the gap region 40 and the thinner silicon nitride film 65B may cover the mon-busbars 38. In another embodiment, illustrated in FIG. 6D, the outer boundary of the thinner silicon nitride film 65B may be slightly within the central interleaved region 70, for example, overlapping the tip regions 75 of the IDT electrode fingers by between 0λ and about 0.3λ and the thinner silicon nitride film 65B may cover the mon-busbars 38. The location of the edge of the thinner silicon nitride film 65B may be selected to achieve a desired amount of suppression of transverse mode spurious signals.

Figure 7:
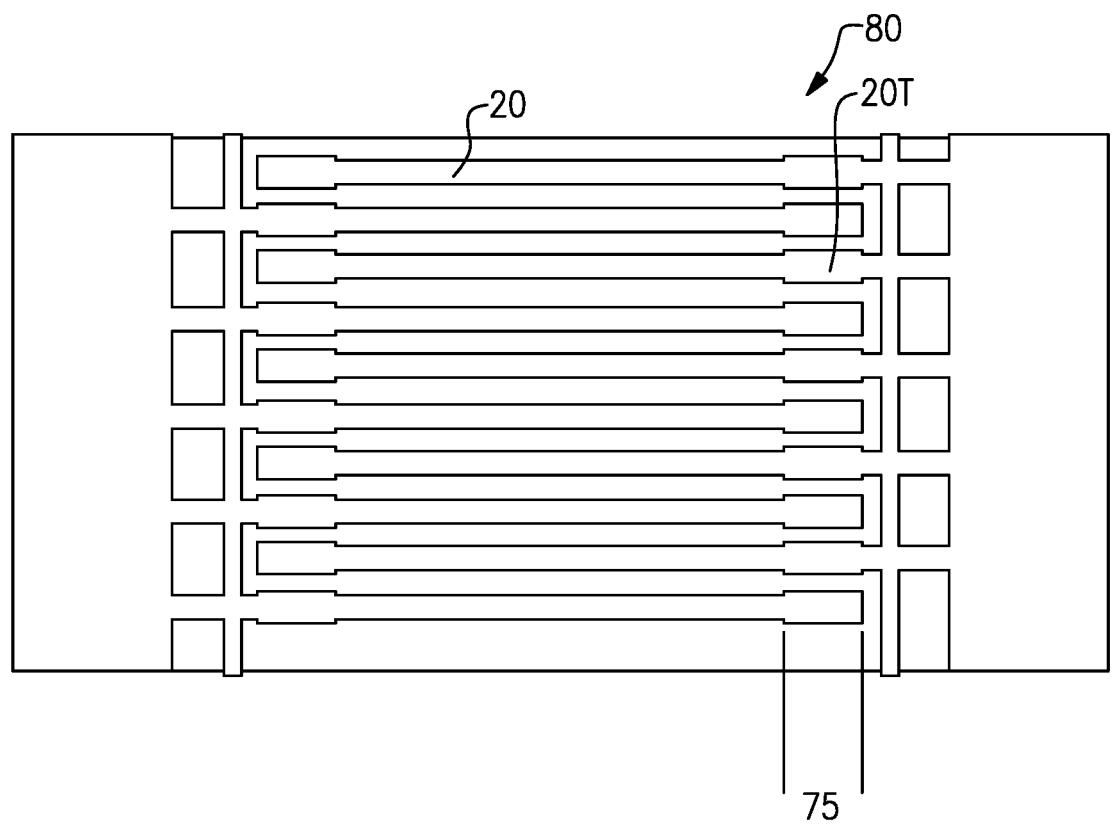
FIG. 7 is a plan view of a portion of another surface acoustic wave resonator.
Figure 8A:
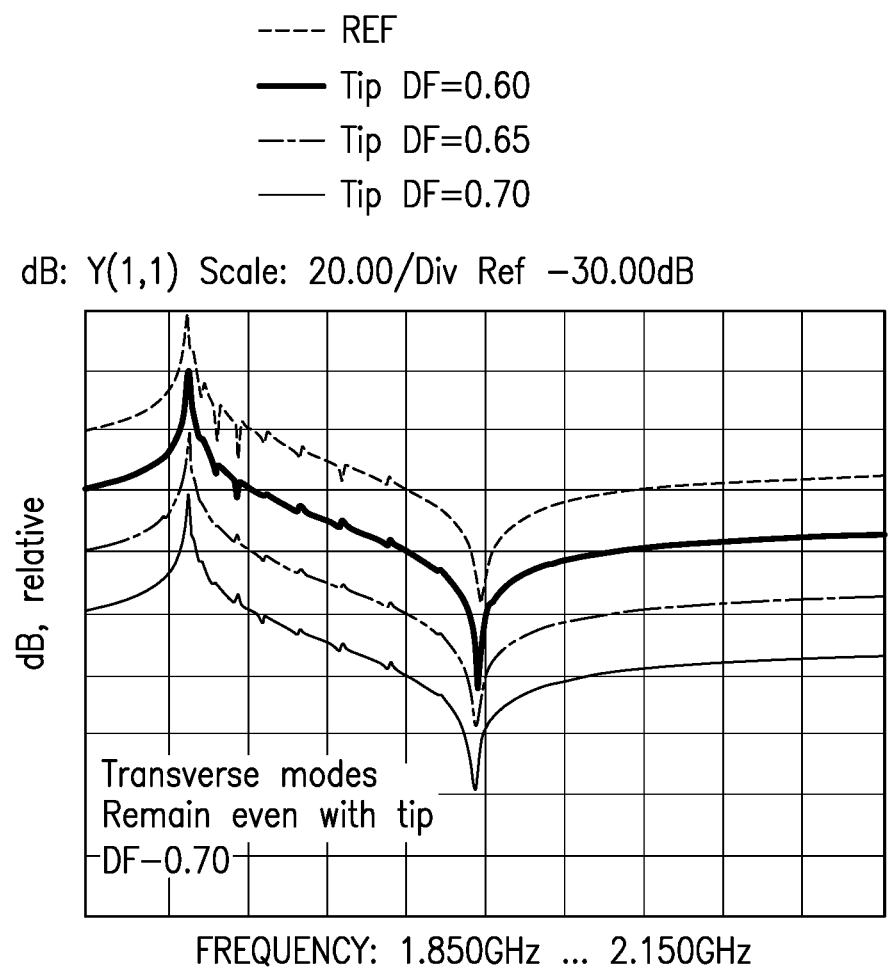
FIG. 8A is a chart comparing admittance versus frequency for a resonator having the IDT electrode structure of FIGS. 2A-2B as compared to resonators having the IDT electrode structure of FIG. 7.
Figure 8B:
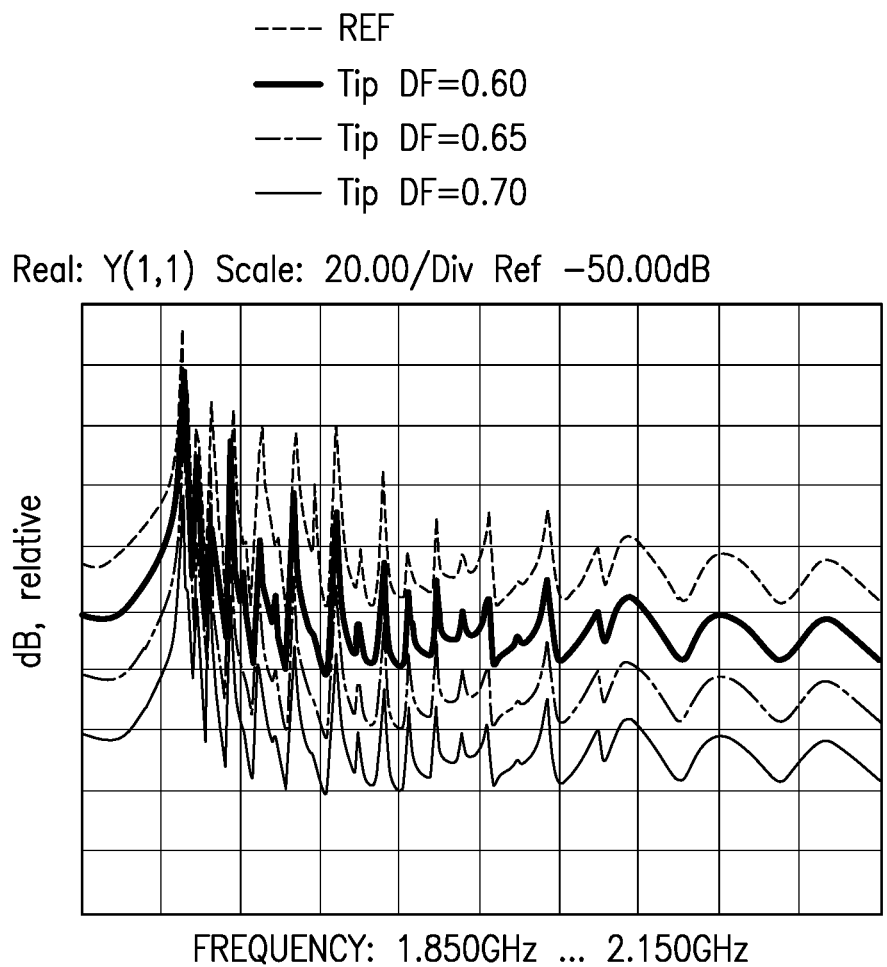
FIG. 8B is a chart comparing real admittance versus frequency for a resonator having the IDT electrode structure of FIGS. 2A-2B as compared to resonators having the IDT electrode structure of FIG. 7.

Another type of surface acoustic wave resonator configuration 80 designed to reduce spurious signals between the resonance and anti-resonance frequencies of the resonator due to transverse mode acoustic waves is illustrated in partial plan view in FIG. 7. In the acoustic wave resonator configuration 80, the tips 20T of the IDT electrode fingers 20 in the tip regions 75 are widened to increase a duty factor of the IDT electrode fingers in the tip region 75 relative to the central interleaved region 70. This configuration may be referred to as a "hammerhead" configuration. In some embodiments, the duty factor of the IDT electrode fingers in the central interleaved region may be about 0.50, while the duty factor of the IDT electrode fingers in the tip region may be from about 0.60 to about 0.70. The charts of FIGS. 8A and 8B compare admittance curves of the REF resonator structure, having an electrode finger duty factor of 0.5, to that of hammerhead resonator structures with an electrode duty factor of 0.5 in the central interleaved region 70 and duty factors in the tip regions 75 ranging from 0.60 to 0.70. As can be seen in these charts even with a duty factor of 0.70 in the tip regions 75, the spurious signals between the resonance and anti-resonance frequencies can still be observed. As in the charts of FIGS. 5A and 5B above, the admittance curves in FIGS. 8A and 8B are vertically separated for ease of viewing, but do not imply any absolute change in the levels of admittance for the different structures.

Figure 9A:
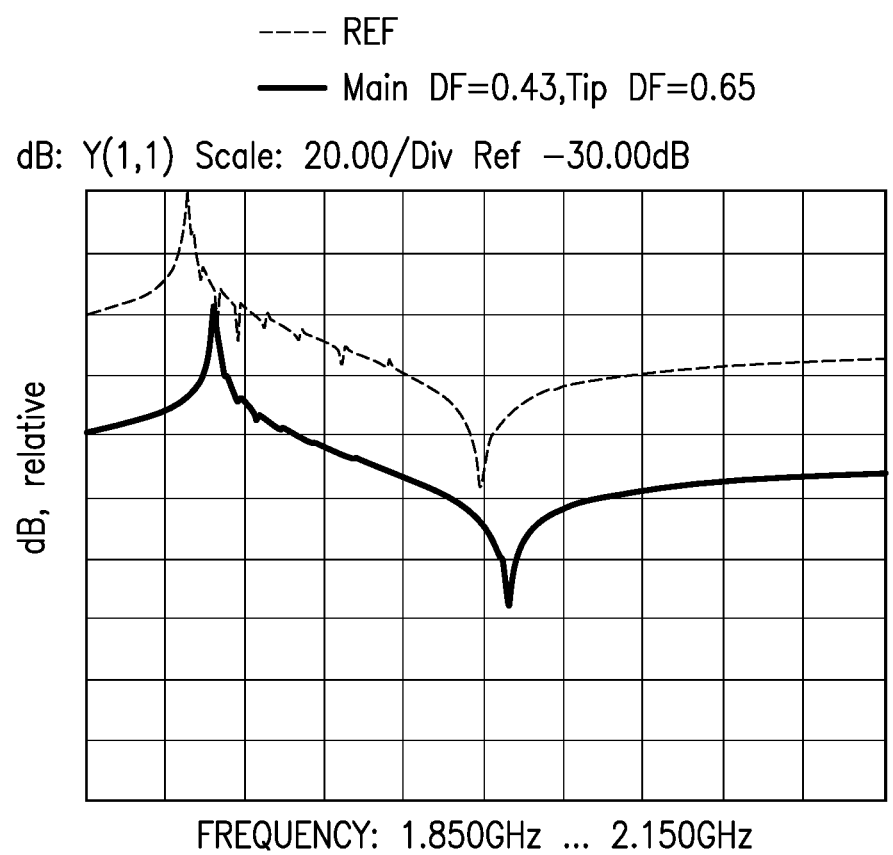
FIG. 9A is a chart comparing admittance versus frequency for a resonator having the IDT electrode structure of FIGS. 2A-2B as compared to a resonator having the IDT electrode structure of FIG. 7 with a reduced central region duty factor.
Figure 9B:
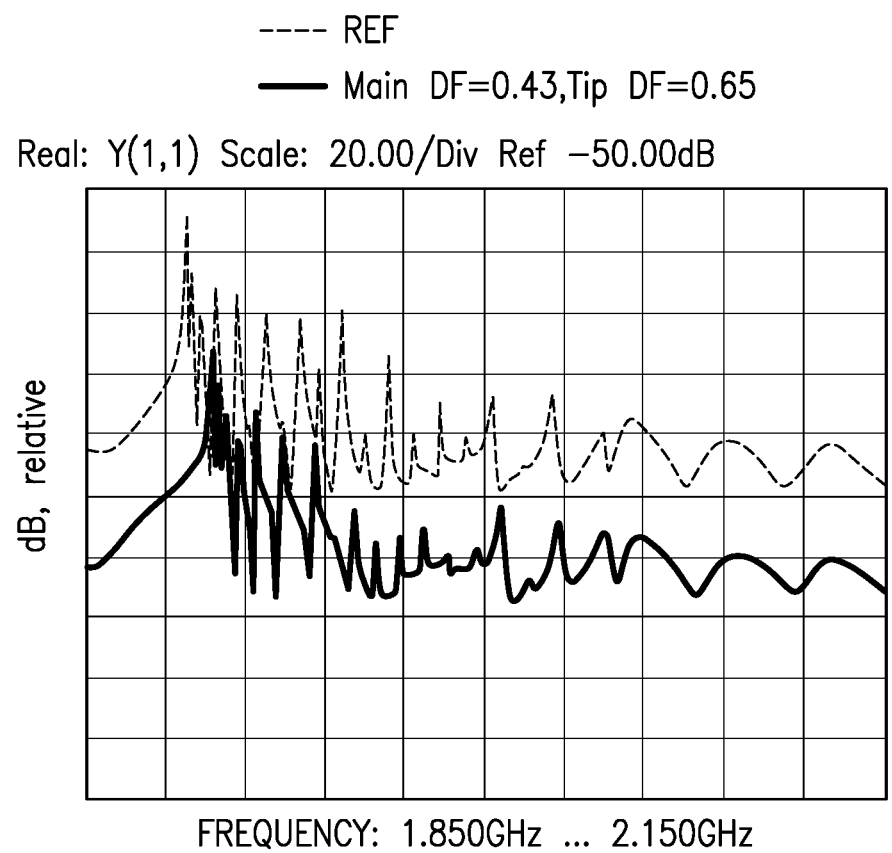
FIG. 9B is a chart comparing real admittance versus frequency for a resonator having the IDT structure of FIGS. 2A-2B as compared to a resonator having the IDT electrode structure of FIG. 7 with a reduced central region duty factor.

A modification to the IDT electrode structure of FIG. 7 that would increase a difference in acoustic velocity between an area within the central interleaved region and areas in the tip regions may involve reducing the duty factor of the IDT electrode fingers in the central interleaved region. As illustrated in the charts of FIGS. 9A and 9B, reducing the duty factor of the IDT electrode fingers in the central interleaved region to 0.43 and setting the duty factor of the IDT electrode fingers in the tip regions to 0.65 may be effective in suppressing the spurious signals between the resonance and anti-resonance frequencies. Such a modification, however, would decrease the static capacitance between adjacent IDT electrode fingers as well as increase the acoustic velocity in the central interleaved region and would thus increase the size of a resonator to achieve comparable resonance and antiresonance frequencies as in the REF resonator structure.

Figure 10A:
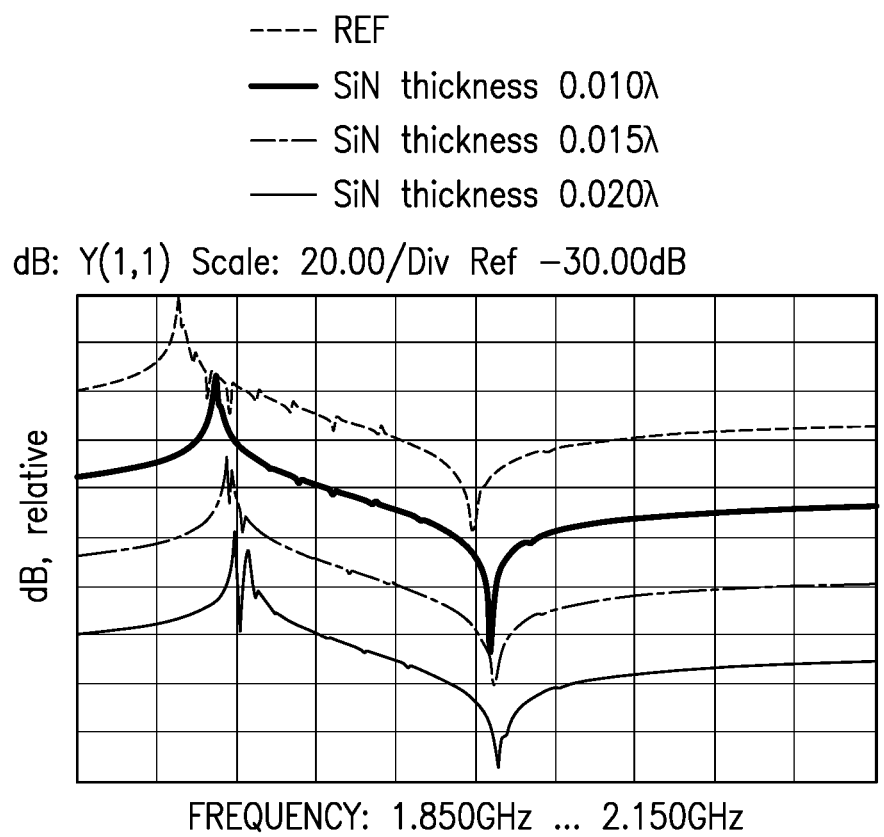
FIG. 10A is a chart comparing admittance versus frequency for resonators having the IDT electrode structure of FIGS. 4A-4B with different silicon nitride thicknesses.
Figure 10B:
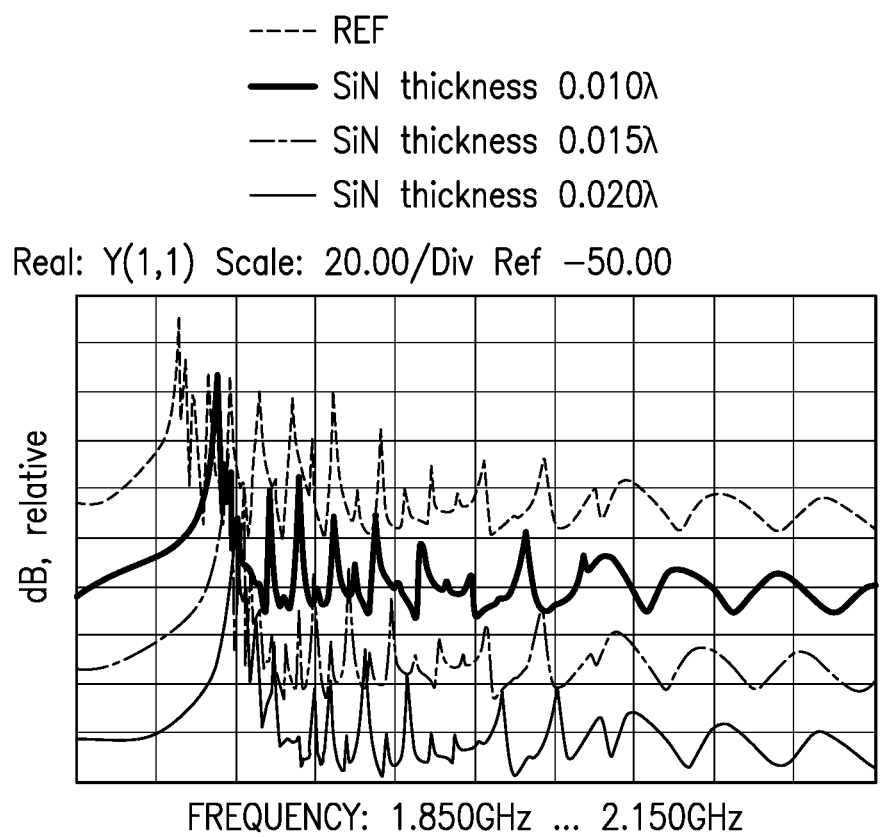
FIG. 10B is a chart comparing real admittance versus frequency for resonators having the IDT electrode structure of FIGS. 4A-4B with different silicon nitride thicknesses.

In a surface acoustic wave resonator having a SiN passivation trench structure as illustrated in FIGS. 4A and 4B with a layer of silicon nitride deposited over the central interleaved region 70 the thickness of the silicon nitride layer can effect both the operating frequency of the resonator and the shape of the admittance curve for the resonator. FIGS. 10A and 10B illustrate the impedance versus frequency and real impedance versus frequency curves, respectively of a surface acoustic wave resonator having a SiN passivation trench structure with tip region thicknesses of 1λ as illustrated in FIGS. 4A and 4B with different silicon nitride layer thicknesses as well as for a surface acoustic wave resonator having the REF structure of FIGS. 2A and 2B. As can be seen in FIGS. 10A and 10B, as the thickness of the silicon nitride layer increases for the acoustic wave resonators having the SiN passivation trench structure from 0.010λ to 0.020λ (curves "SiN thickness 0.010λ," "SiN thickness 0.015λ," and "SiN thickness 0.020λ") the operating frequency of the resonators increased and discontinuities began to appear in the admittance curves at about the resonance frequencies. A silicon nitride layer thickness that provided for a desirable amount of suppression of the transverse mode discontinuities and that did not cause significant discontinuities in admittance around the resonance frequency was 0.010λ.

Figure 10C:
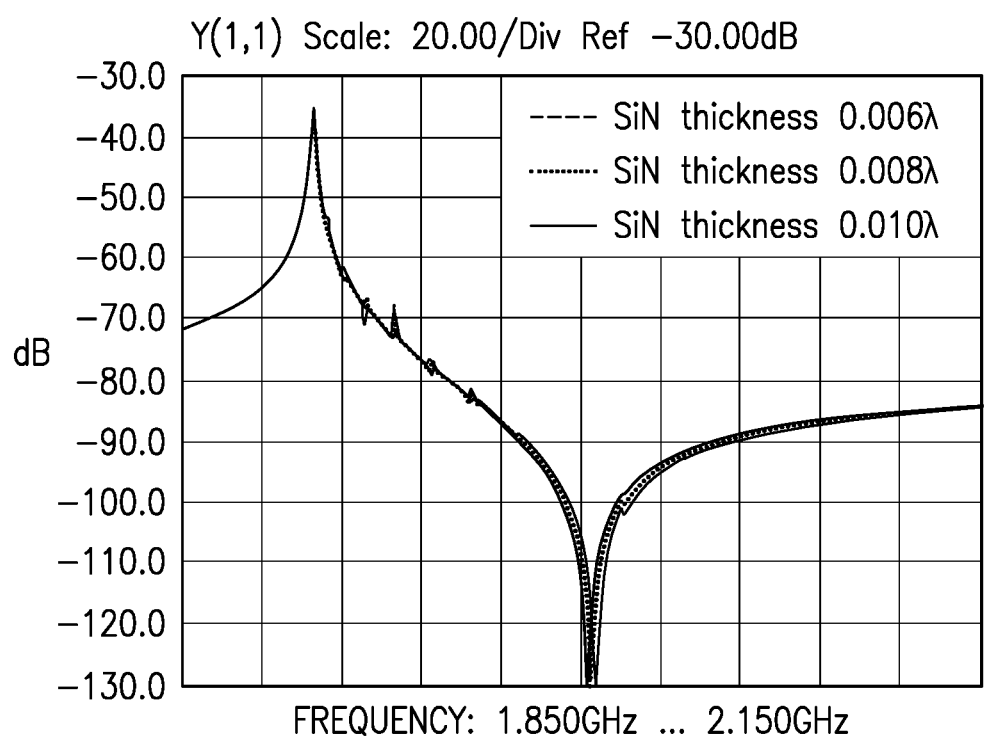
FIG. 10C is a chart comparing admittance versus frequency for resonators having the IDT electrode structure of FIGS. 4A-4B with different silicon nitride thicknesses.
Figure 10D:
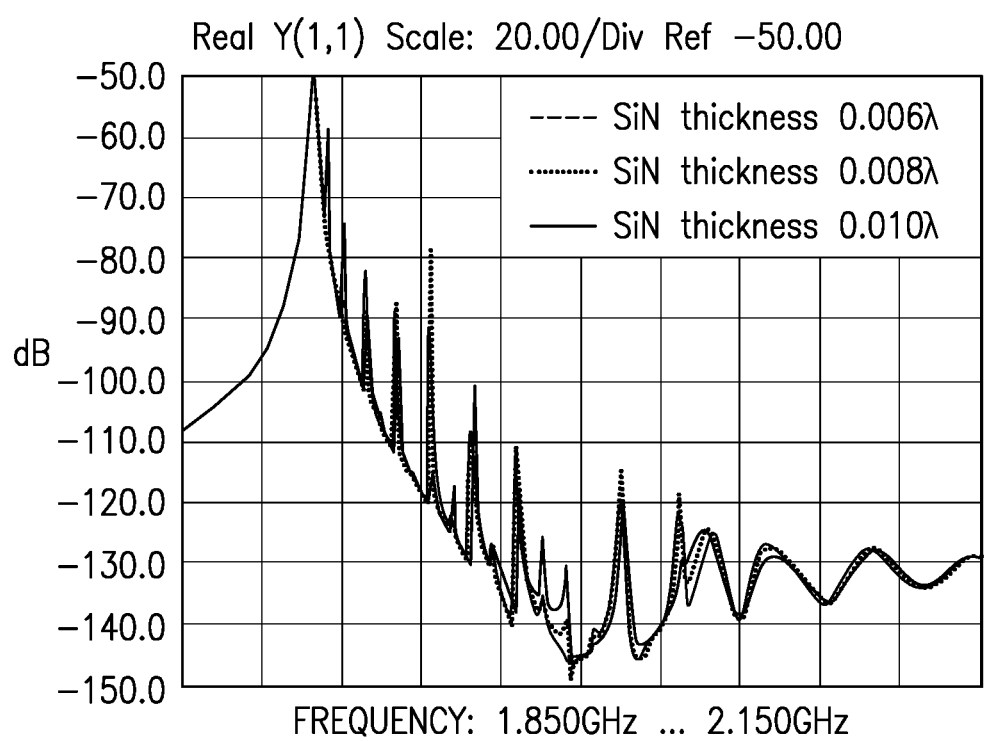
FIG. 10D is a chart comparing real admittance versus frequency for resonators having the IDT electrode structure of FIGS. 4A-4B with different silicon nitride thicknesses.
Figure 10E:
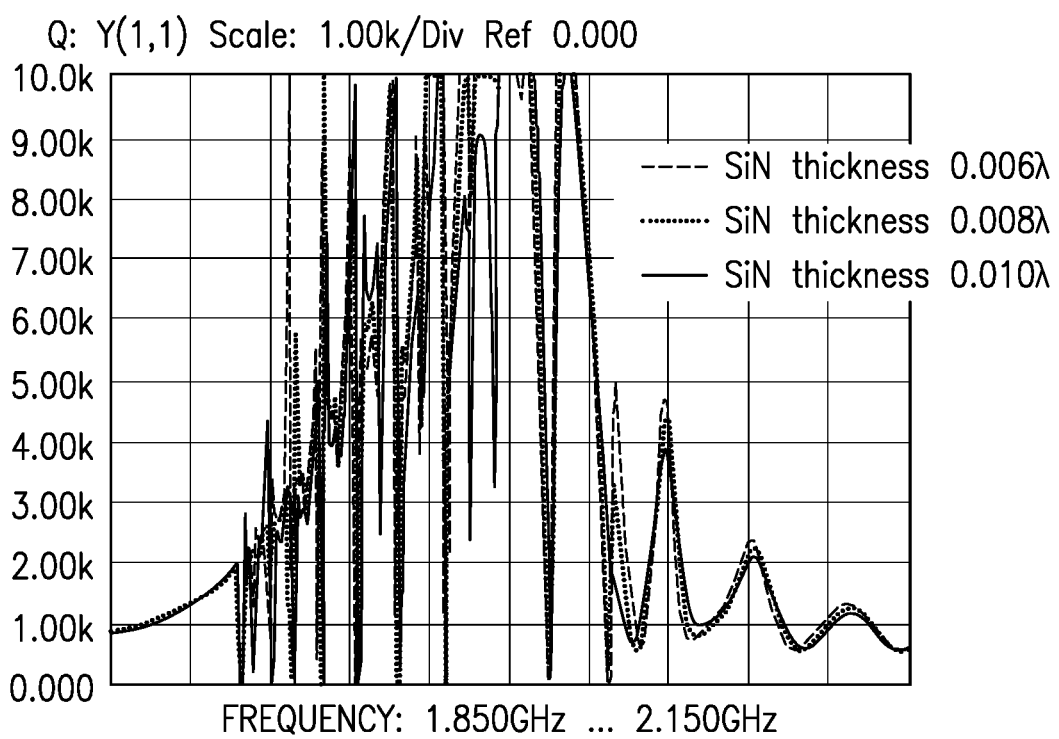
FIG. 10E is a chart comparing quality factor versus frequency for resonators having the IDT electrode structure of FIGS. 4A-4B with different silicon nitride thicknesses.

Simulations were performed to examine the effect of additional silicon nitride layer thicknesses and IDT electrode tip region 75 width on performance characteristics of a surface acoustic wave resonator having a SiN passivation trench structure as illustrated in FIGS. 4A and 4B with a layer of silicon nitride deposited over the central interleaved region 70. FIGS. 10C-10E illustrate the effect on admittance, real admittance, and quality factor of silicon nitride layer thickness when the IDT electrode tip region 75 width was set at 1λ. In these charts, the resonance frequencies of the resonators were adjusted so the curves overlapped to provide a good comparison. Resonators were simulated having silicon nitride layer thicknesses of 0.006λ, 0.008λ, and 0.010λ in the central interleaved region 70. Good suppression of transverse mode spurious signals was observed in the simulation results for each of these different silicon nitride layer thicknesses.

Figure 10F:
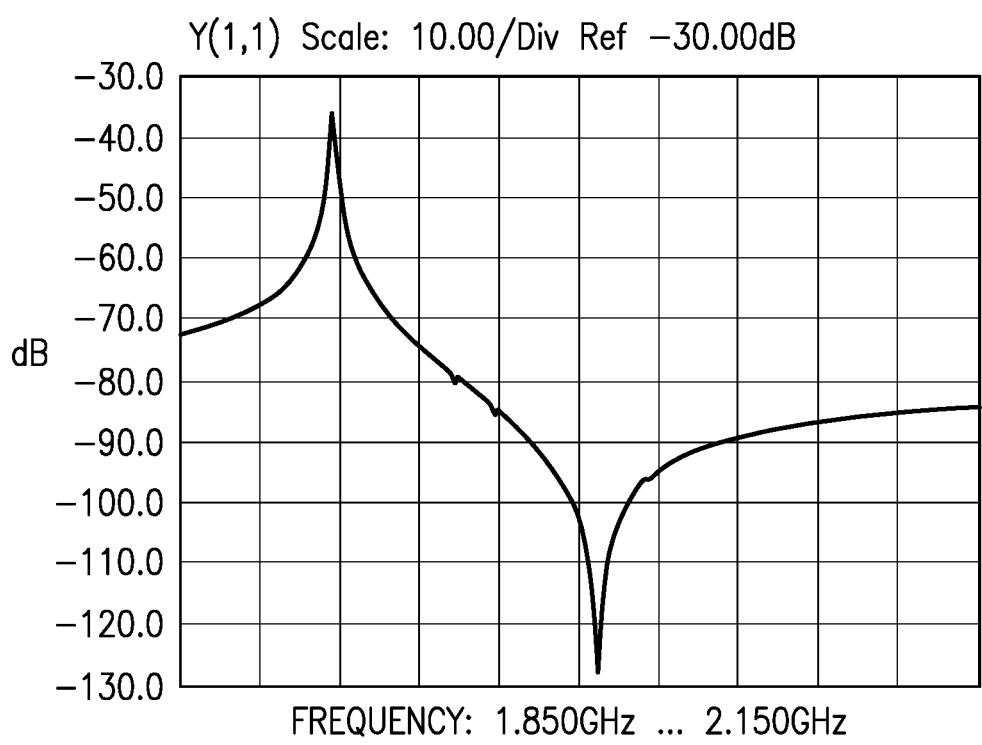
FIG. 10F is a chart comparing admittance versus frequency for resonators having the IDT electrode structure of FIGS. 4A-4B with a silicon nitride thickness of $0.015\lambda$ and an electrode finger tip width of $0.75\lambda$.
Figure 10G:
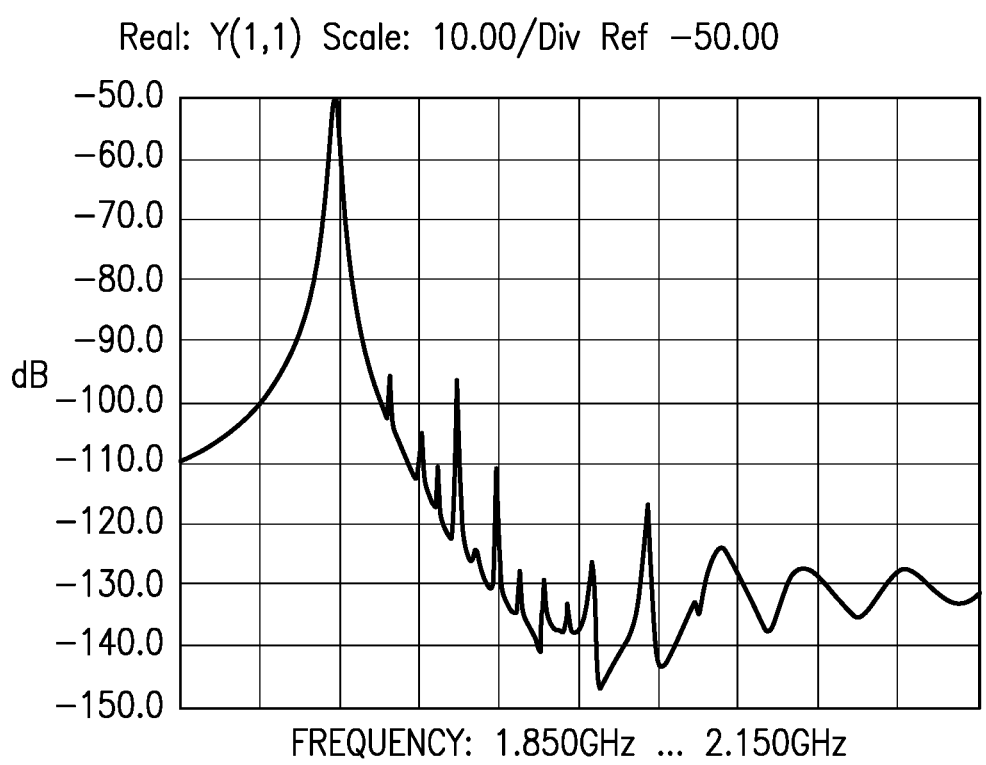
FIG. 10G is a chart comparing real admittance versus frequency for resonators having the IDT electrode structure of FIGS. 4A-4B with a silicon nitride thickness of $0.015\lambda$ and an electrode finger tip width of $0.75\lambda$.
Figure 10H:
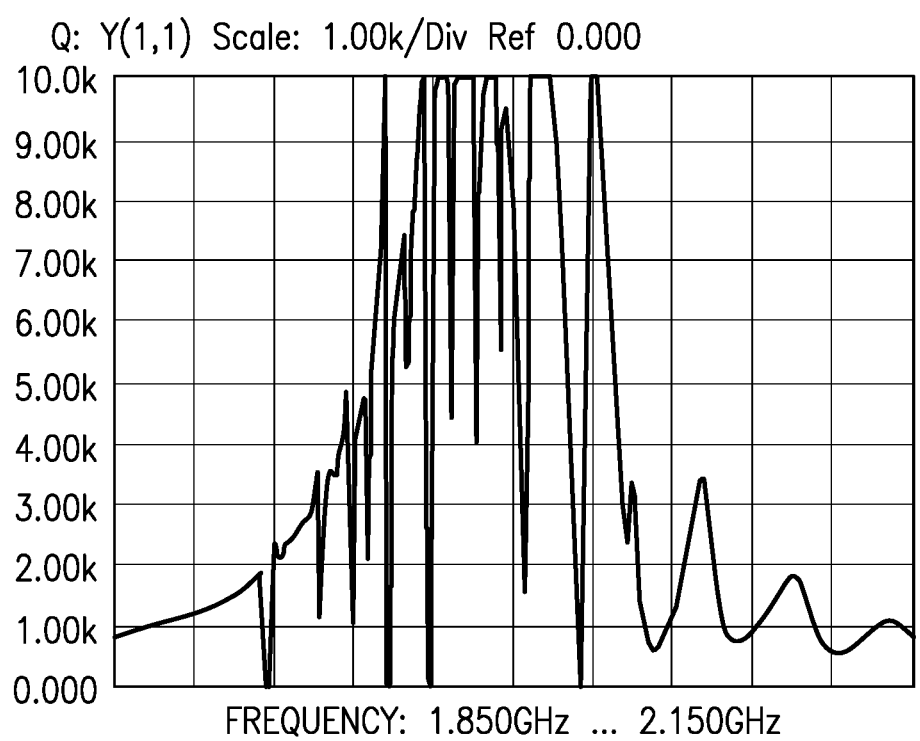
FIG. 10H is a chart comparing quality factor versus frequency for resonators having the IDT electrode structure of FIGS. 4A-4B with a silicon nitride thickness of $0.015\lambda$ and an electrode finger tip width of $0.75\lambda$.

FIGS. 10F-10H illustrate results of simulations of admittance, real admittance, and quality factor of a surface acoustic wave resonator having a SiN passivation trench structure as illustrated in FIGS. 4A and 4B with a layer of silicon nitride 0.015λ deposited over the central interleaved region 70 when the IDT electrode tip region 75 width was set at 0.75λ. Again, good suppression of transverse mode spurious signals was observed.

Figure 10I:
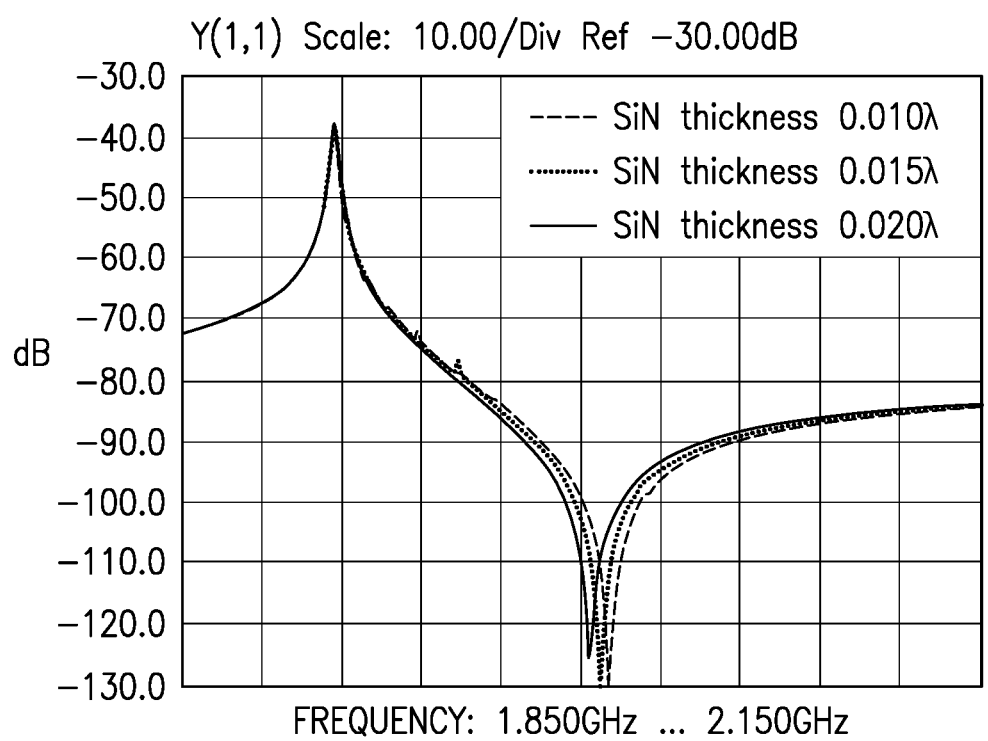
FIG. 10I is a chart comparing admittance versus frequency for resonators having the IDT electrode structure of FIGS. 4A-4B with different silicon nitride thicknesses and an electrode finger tip width of $0.5\lambda$.
Figure 10J:
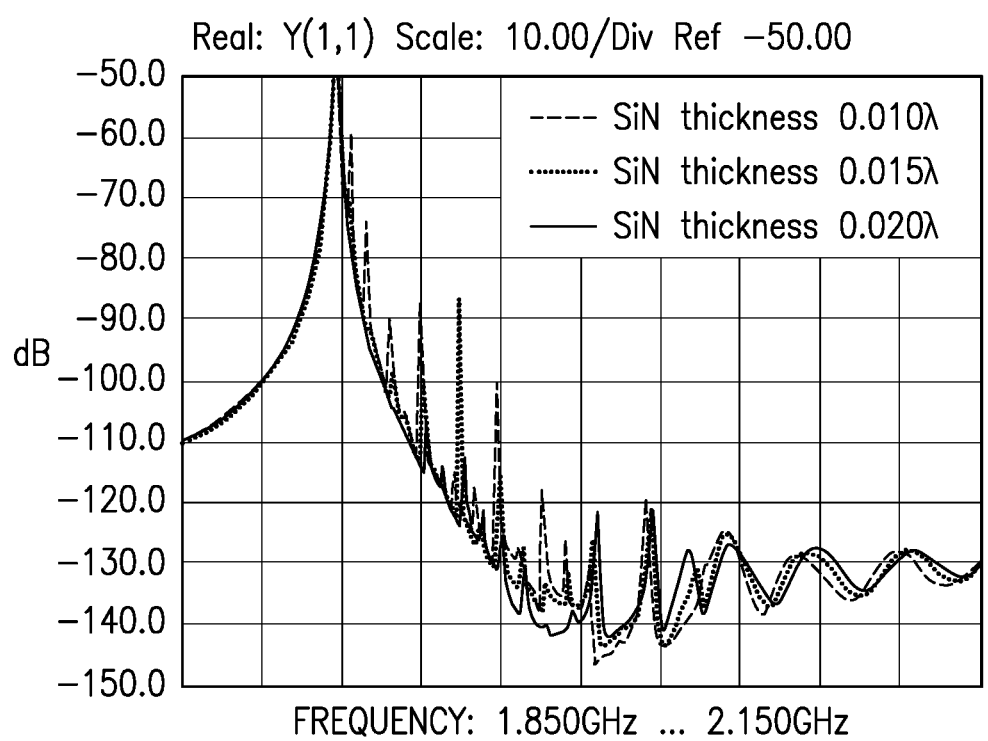
FIG. 10J is a chart comparing real admittance versus frequency for resonators having the IDT electrode structure of FIGS. 4A-4B with different silicon nitride thicknesses and an electrode finger tip width of $0.5\lambda$.
Figure 10K:
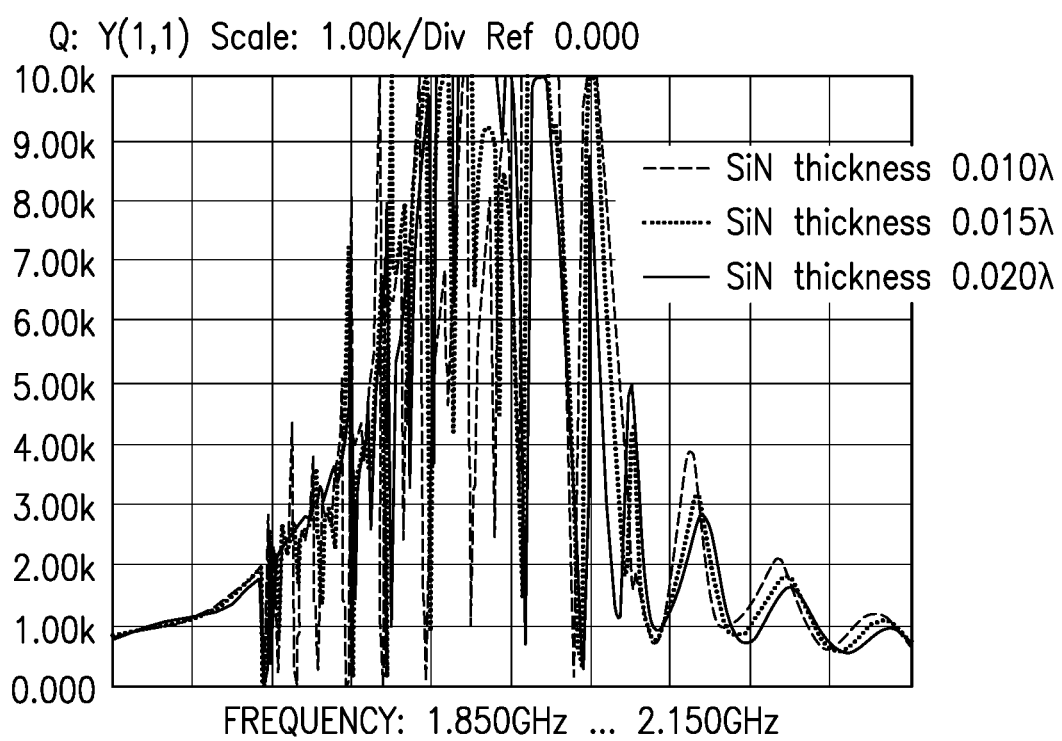
FIG. 10K is a chart comparing quality factor versus frequency for resonators having the IDT electrode structure of FIGS. 4A-4B with different silicon nitride thicknesses and an electrode finger tip width of $0.5\lambda$.

FIGS. 10I-10K illustrate results of simulations of admittance, real admittance, and quality factor of a surface acoustic wave resonator having a SiN passivation trench structure as illustrated in FIGS. 4A and 4B with a layers of silicon nitride 0.010λ thick, 0.015λ thick, and 0.020λ thick deposited over the central interleaved region 70 when the IDT electrode tip region 75 width was set at 0.5λ. Better suppression of transverse mode spurious signals was observed for the 0.015λ silicon nitride thickness and 0.02λ silicon nitride thickness simulations than for the 0.010λ silicon nitride thickness simulation.

The above simulations show that in a surface acoustic wave resonator having a SiN passivation trench structure as illustrated in FIGS. 4A and 4B, as the IDT electrode finger tip region widths decrease it may be desirable to increase the silicon nitride layer thickness to achieve better suppression of transverse mode spurious signals.

Figure 10L:
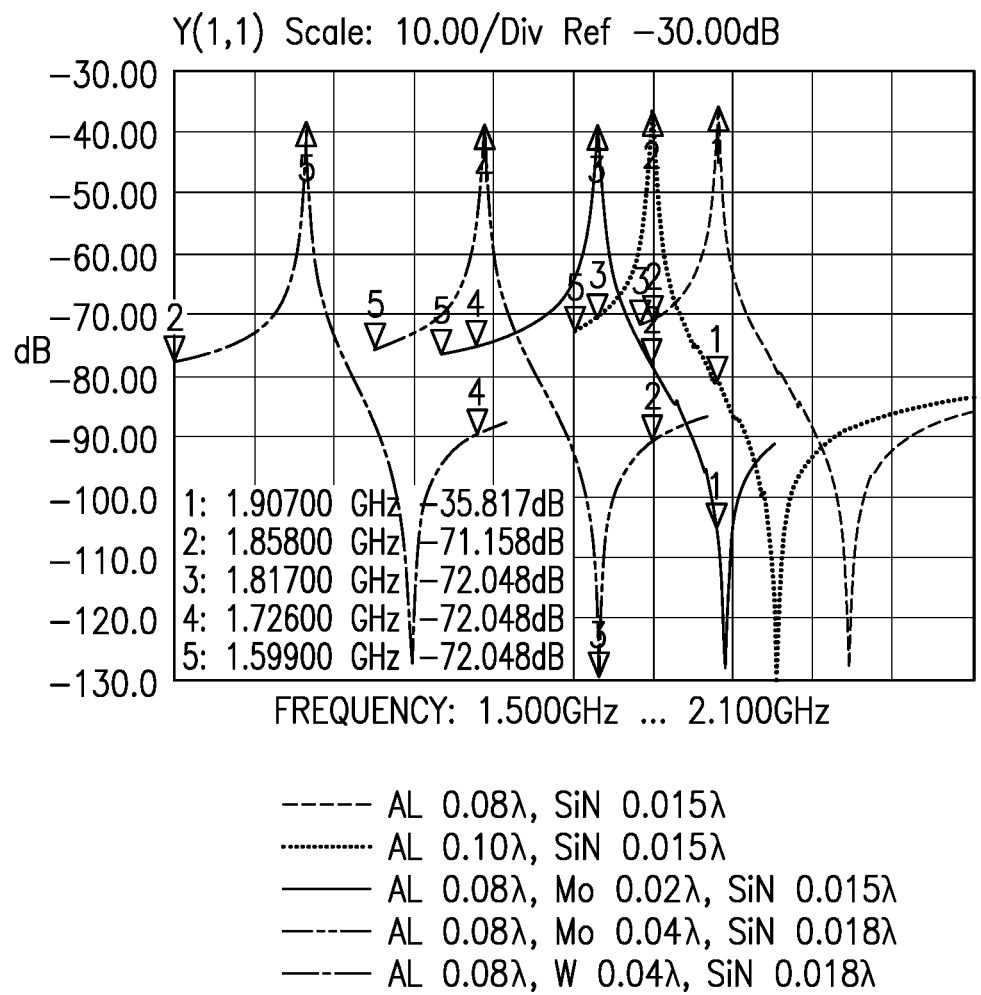
FIG. 10L is a chart comparing admittance versus frequency for resonators having the IDT electrode structure of FIGS. 4A-4B with different electrode materials and thicknesses and different silicon nitride layer thicknesses.
Figure 10M:
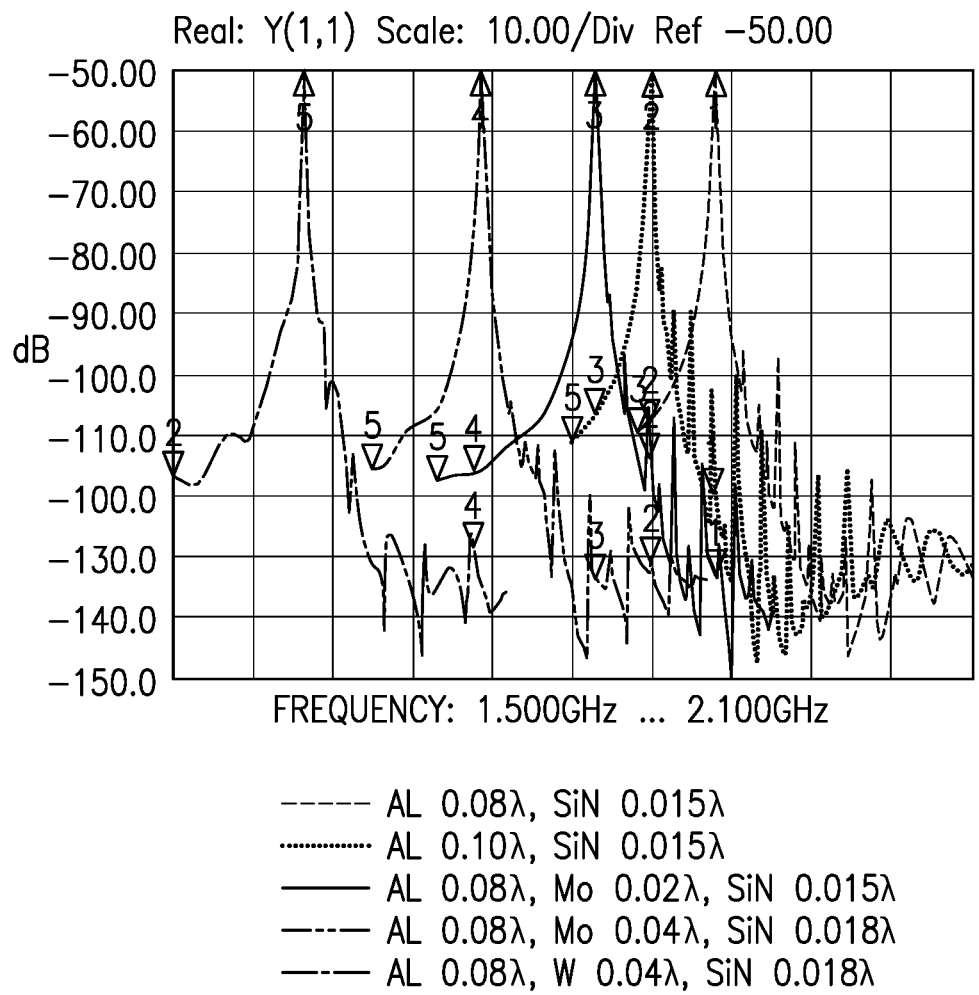
FIG. 10M is a chart comparing real admittance versus frequency for resonators having the IDT electrode structure of FIGS. 4A-4B with different electrode materials and thicknesses and different silicon nitride layer thicknesses.
Figure 10N:
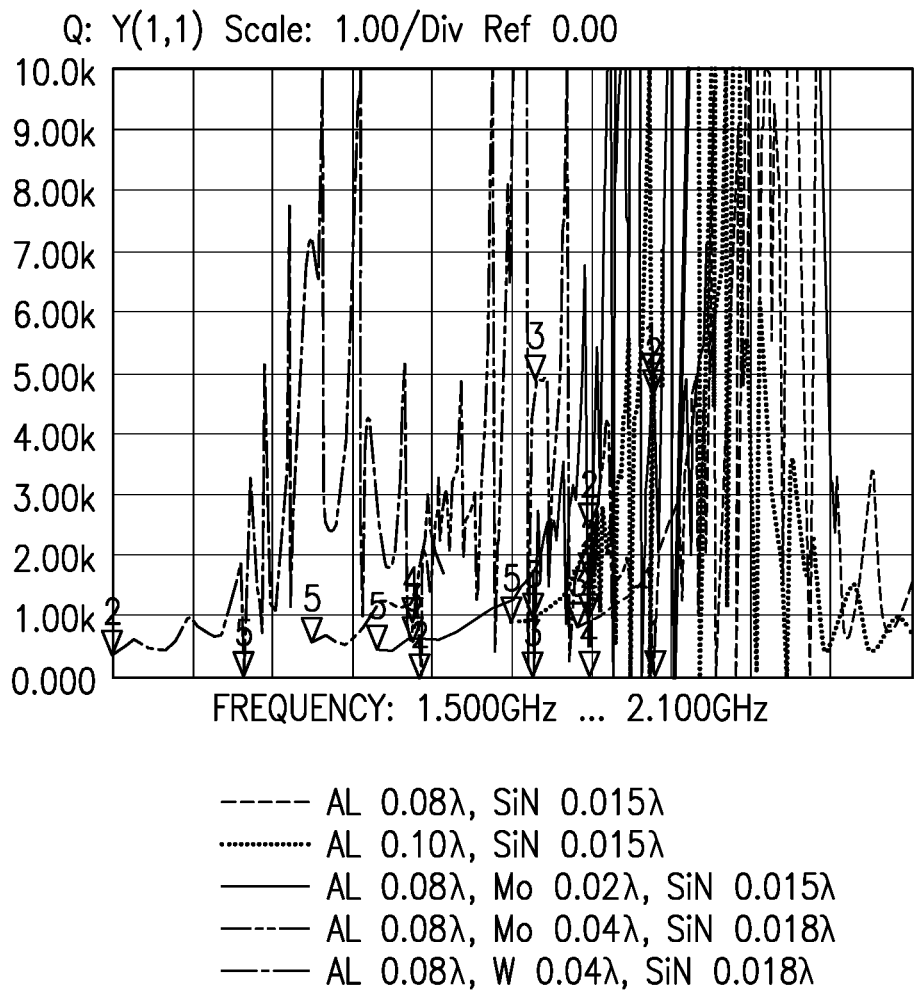
FIG. 10N is a chart comparing quality factor versus frequency for resonators having the IDT electrode structure of FIGS. 4A-4B with different electrode materials and thicknesses and different silicon nitride layer thicknesses.

Additional simulations were performed to determine the effect of electrode material and thickness and silicon nitride thickness on performance characteristics of a surface acoustic wave resonator having a SiN passivation trench structure as illustrated in FIGS. 4A and 4B. FIGS. 10L-10N illustrate results of simulations of admittance, real admittance, and quality factor of a surface acoustic wave resonator having a SiN passivation trench structure as illustrated in FIGS. 4A and 4B with IDT electrodes formed of Al (0.08λ or 0.10λ thick) or an Al/Mo stack with Al layers 0.08λ thick and Mo layers either 0.02λ or 0.04λ thick. The silicon nitride layer thickness was simulated as either 0.015λ or 0.018λ thick. The IDT electrode tip width was fixed at 0.075λ. The curves are offset in frequency in FIGS. 10L-10N so that the different curves may be more easily seen. These results show that resonators including ticker/heavier IDT electrodes, which provides for reduced device size, and having the SiN passivation trench structure may exhibit acceptable suppression of transverse mode spurious signals in their admittance curves. Acoustic wave resonators having the SiN passivation trench structure as disclosed herein with a range of IDT electrode tip widths of from about 0.5λ to about 1.2λ, thicker/heavier IDT electrodes as simulated to provide the results of FIGS. 10L-10N, and silicon nitride layer 65 thicknesses ranging from 0.01λ to about 0.025λ may exhibit desirable suppression of transverse mode spurious signals in their admittance curves.

Figure 11A:
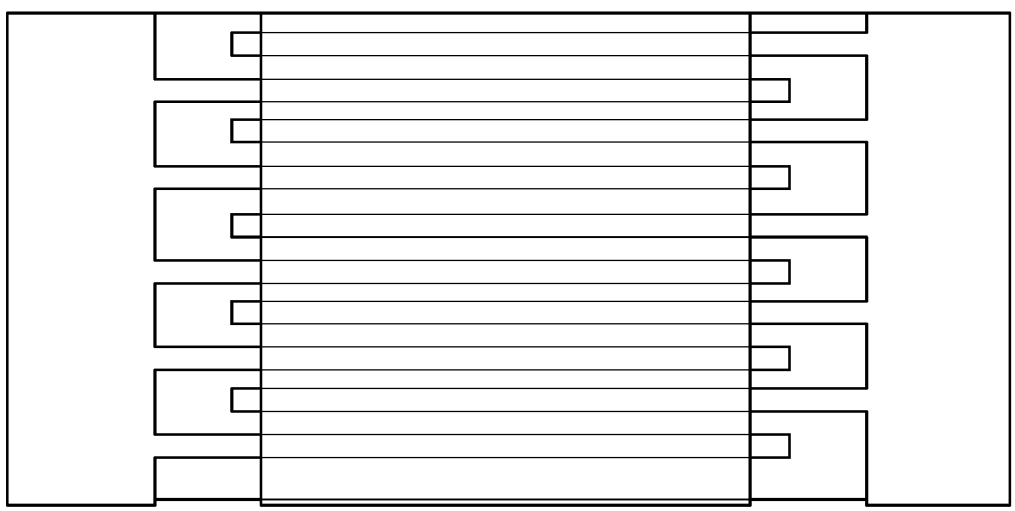
FIG. 11A is a plan view of a portion of another surface acoustic wave resonator.
Figure 11B:
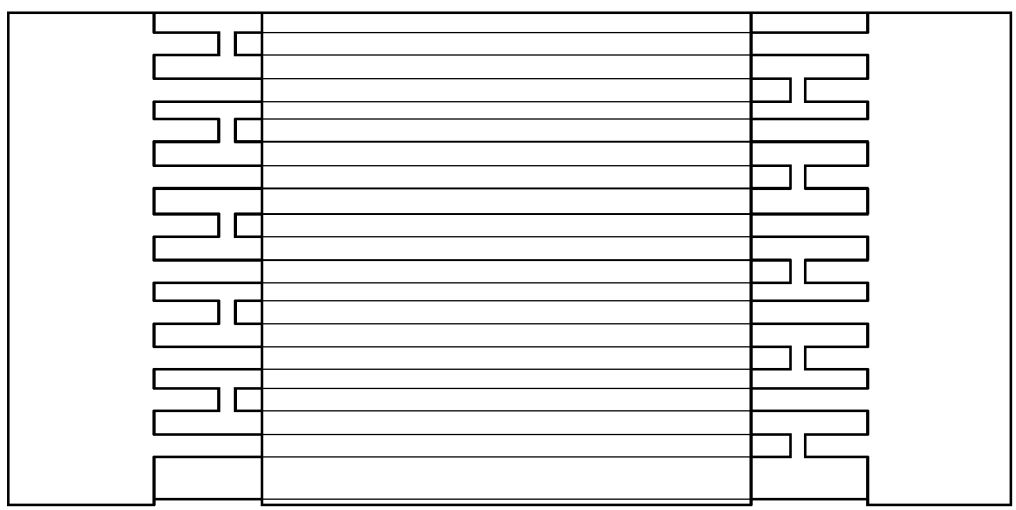
FIG. 11B is a plan view of a portion of another surface acoustic wave resonator.

Simulations were performed to examine the effect of different IDT electrode structures in the gap regions of surface acoustic wave electrodes including a layer of silicon nitride disposed on the central interleaved region. The structure including the mini-busbar electrode 38 illustrated in FIGS. 4A and 4B was considered the "SiN passivation baseline" structure. The performance of a surface acoustic wave resonator having the SiN passivation baseline structure was compared to that of a resonator lacking the mini-busbar electrode (FIG. 11A) and a resonator lacking the mini-busbar electrode and including dummy electrode fingers (FIG. 11B). The tip regions of the IDT electrode fingers that were uncovered by silicon nitride were 1λ wide for each of these structures. The silicon nitride layer thickness was 0.010λ for each of these structures.

Figure 12A:
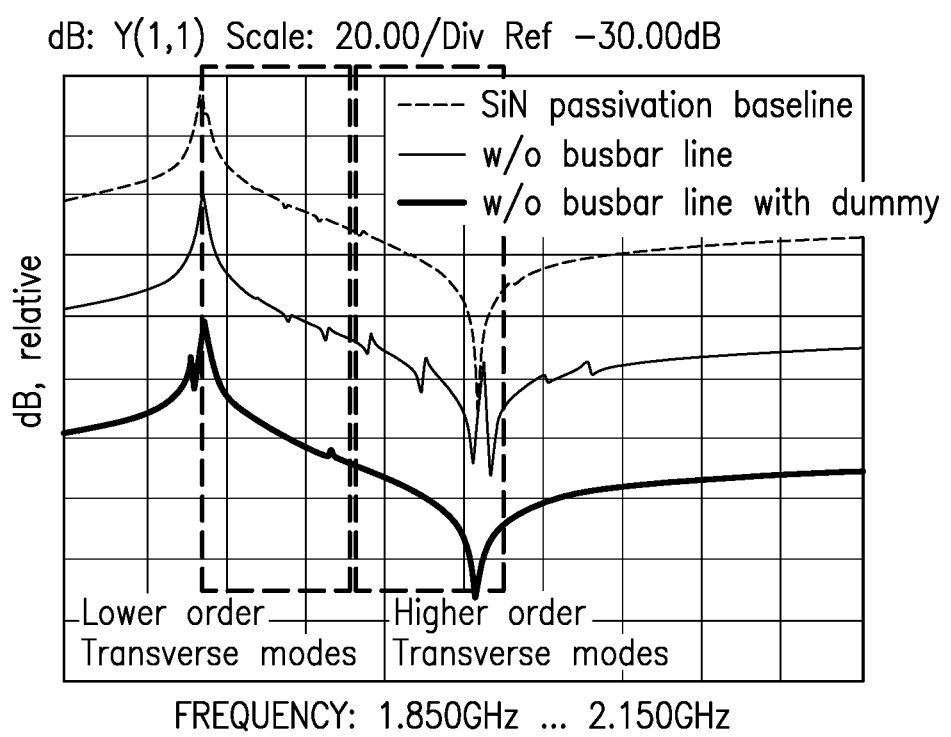
FIG. 12A is a chart comparing admittance versus frequency for a resonator having the IDT electrode structure of FIGS. 4A-4B, a resonator having the IDT electrode structure of FIG. 11A, and a resonator having the IDT electrode structure of FIG. 11B.
Figure 12B:
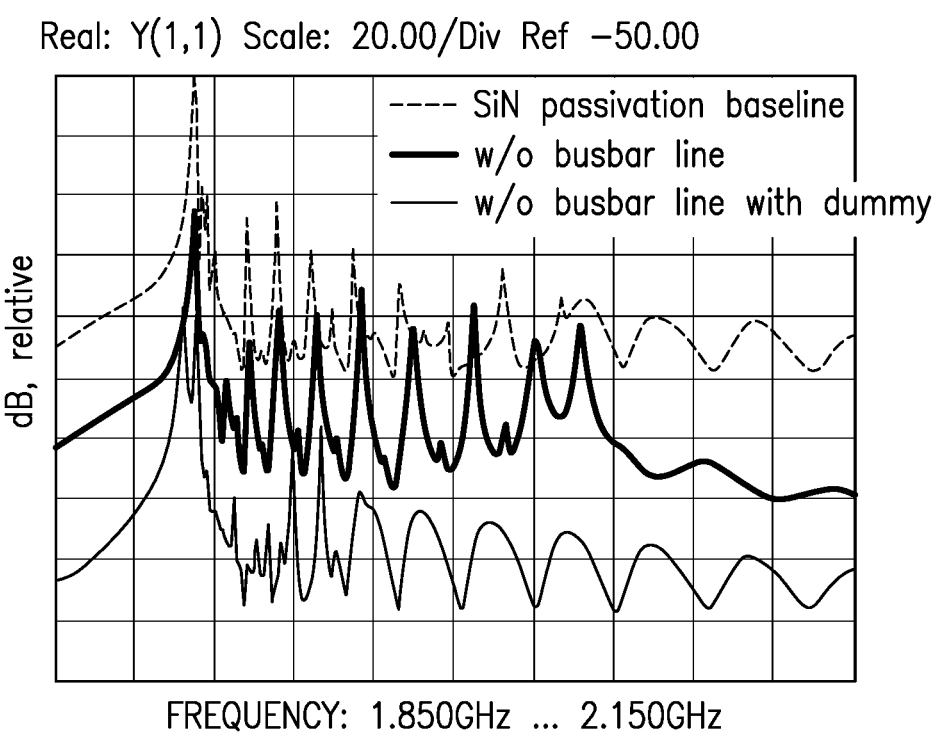
FIG. 12B is a chart comparing real admittance versus frequency for a resonator having the IDT electrode structure of FIGS. 4A-4B, a resonator having the IDT electrode structure of FIG. 11A, and a resonator having the IDT electrode structure of FIG. 11B.

The results of the simulations are illustrated in FIGS. 12A and 12B, including admittance and real admittance curves for each of the simulated structures. As can be observed, in the structure of FIG. 11A in which the mini-busbar electrode was removed, spurious signals appeared in the admittance curve around the antiresonance frequency. This shows that the mini-busbar electrode is useful in suppressing high order transverse acoustic wave modes that might otherwise cause the spurious signals in the curve for the resonator lacking the mini-busbar electrode. In the structure of FIG. 11B in which the mini-busbar electrode was removed and dummy electrode fingers added, spurious signals appeared in the admittance curve around the resonance frequency. This shows that the mini-busbar electrode is more useful than dummy electrodes in suppressing low order transverse acoustic wave modes that might otherwise cause the spurious signals in the curve for the resonator lacking the mini-busbar electrode but including dummy electrode fingers.

Figure 13A:
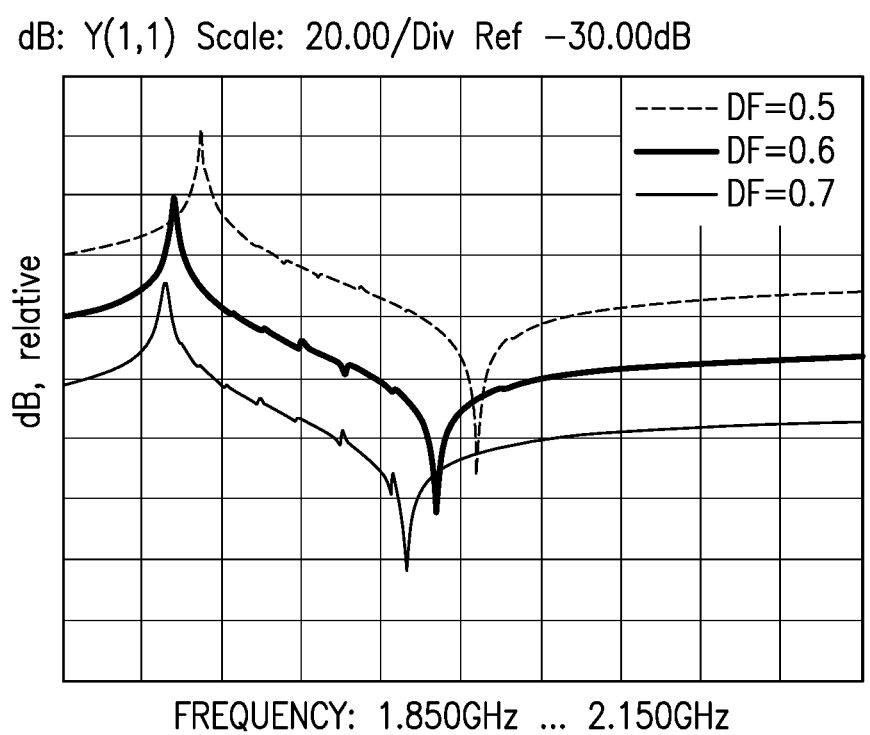
FIG. 13A is a chart comparing admittance versus frequency for resonators having the IDT electrode structure of FIGS. 4A-4B with different IDT electrode finger duty factors.
Figure 13B:
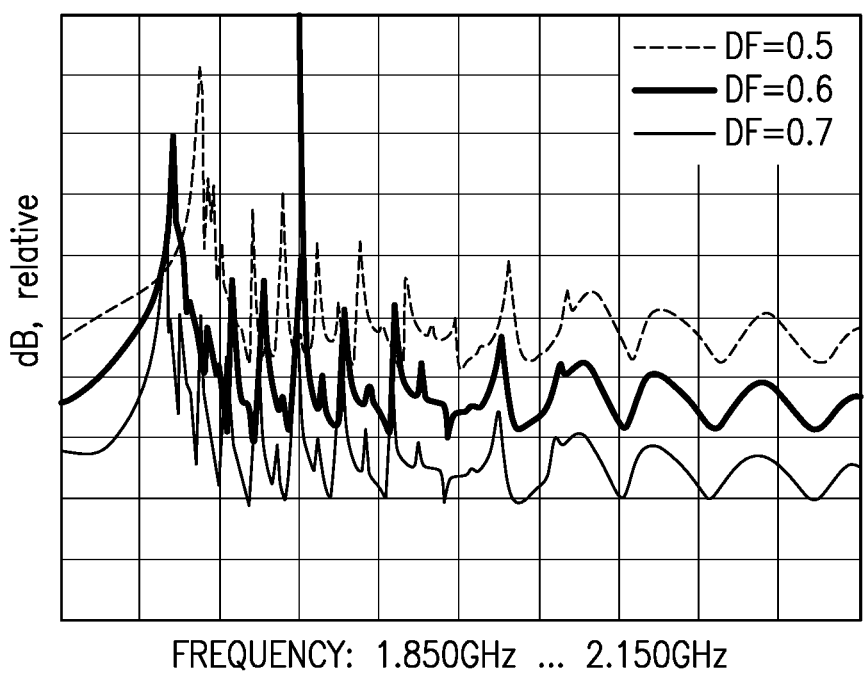
FIG. 13B is a chart comparing real admittance versus frequency for resonators having the IDT electrode structure of FIGS. 4A-4B with different IDT electrode finger duty factors.

Simulations were performed to examine the effect of different IDT electrode finger duty factors in surface acoustic wave electrodes including a layer of silicon nitride disposed on the central interleaved region and tip regions with widths of 1λ uncovered by silicon nitride as illustrated in FIGS. 4A and 4B on the admittance curve and real admittance curve of the resonators. The results of these simulations are illustrated in FIGS. 13A and 13B, respectively, for resonators as illustrated in FIGS. 4A and 4B with IDT electrode finger duty factors (DF) of 0.5, 0.6, and 0.7. As the duty factor of the IDT electrode fingers increased from 0.5 to 0.7, the transverse mode spurious signals in the admittance curve increased only modestly. This suggests that in surface acoustic wave electrodes including a layer of silicon nitride disposed on the central interleaved region as illustrated in FIGS. 4A and 4B the duty factor of the IDT electrode fingers may be increased without significant adverse effects on admittance. The increase in IDT electrode finger duty factor is desirable in that it increases static capacitance between adjacent IDT electrode fingers and reduces the acoustic velocity in the resonator, which provides for the resonator to be made smaller for a given operating frequency.

Figure 14:
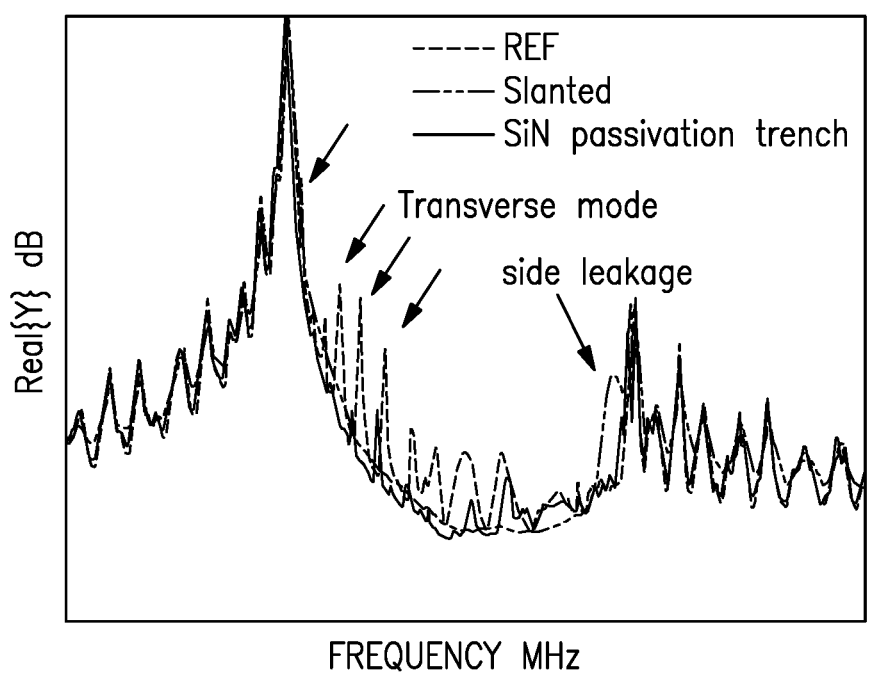
FIG. 14 is a chart of real admittance versus frequency for acoustic wave resonators having three different configurations.

Experiments were performed to compare the performance of resonators such as illustrated in FIGS. 2A and 2B ("REF" embodiment) to resonators with slanted IDT electrode structures such as illustrated in FIG. 3 ("Slanted" embodiment) and to resonators including a layer of silicon nitride disposed on the central interleaved region as illustrated in FIGS. 4A and 4B ("SiN passivation trench" embodiment). Curves of real admittance versus frequency for these three resonator types are illustrated in the chart of FIG. 14. As can be observed from this chart, the resonator without the silicon nitride layer (the "REF" structure) exhibited a greater amplitude and number transverse mode spurious signals above the resonance frequency as compared to the other two resonator types. The Slanted resonator type exhibited worse side energy leakage at frequencies approaching the anti-resonance frequency. The "SiN passivation trench" embodiment exhibited the best performance with respect to real admittance among the three resonator types tested.

Figure 15:
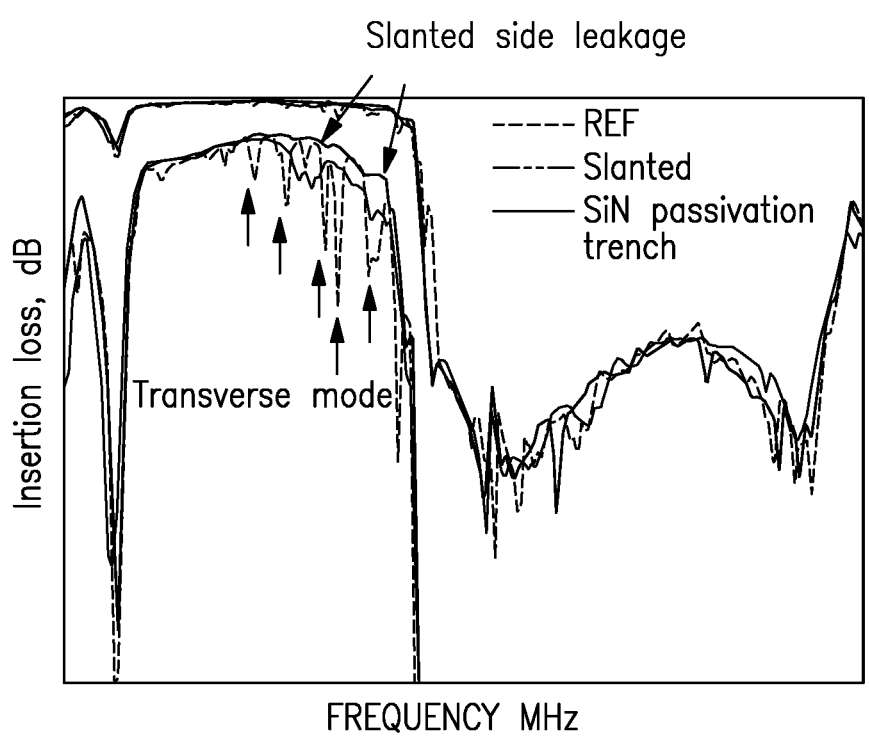
FIG. 15 is a chart of insertion loss versus frequency for ladder filters formed of acoustic wave resonators having three different configurations.

Ladder filters were formed from the resonators having the "REF" structure, the "Slanted" structure, and the "SiN passivation trench" structure. Results of tests of insertion loss versus frequency for the ladder filters formed of these different resonator types are illustrated in the chart of FIG. 15. As can be seen in the chart of FIG. 15 in the ladder filter formed of the resonators having the "REF" structure, discontinuities associated with transverse mode spurious signals appeared within the passband of the filter. In the ladder filter formed of the resonators having the "Slanted" structure, discontinuities associated with side energy leakage appeared within the passband of the filter. The filter formed of the resonators having the "SiN passivation trench" structure exhibited the most desirable insertion loss curve among the three filters tested.

Figure 16:
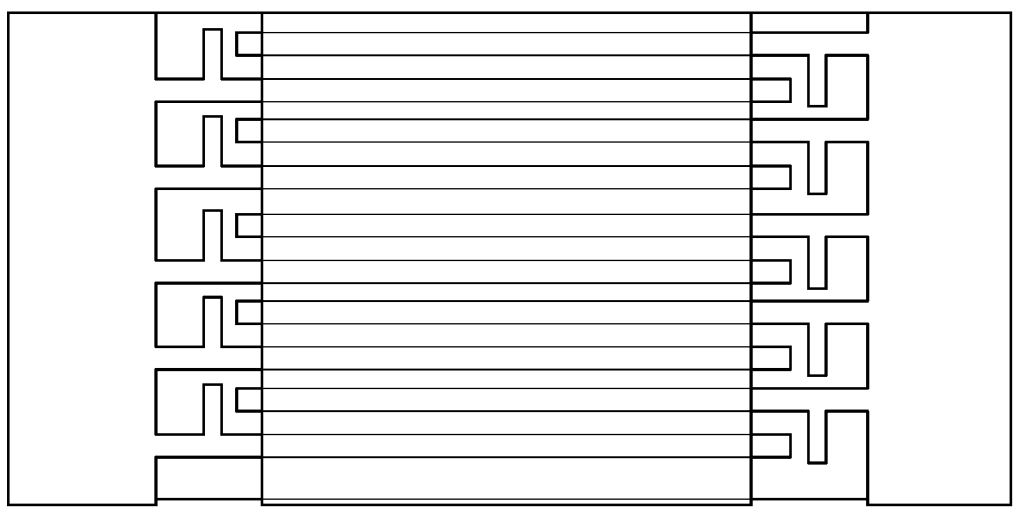
FIG. 16 is a plan view of a portion of a surface acoustic wave resonator having disconnected mini-busbars.
Figure 17A:
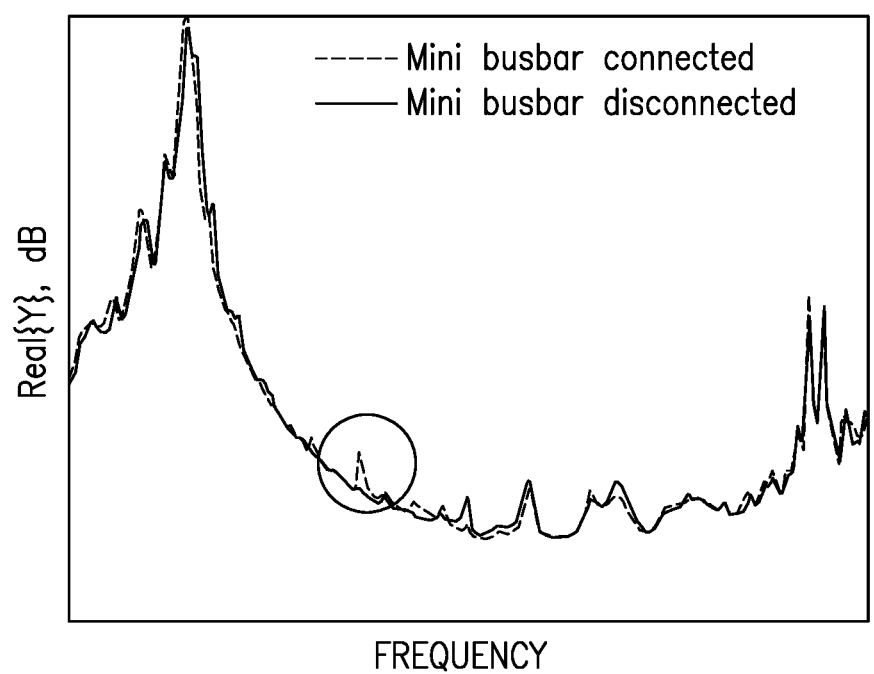
FIG. 17A is a chart of real admittance versus frequency for acoustic wave resonators including continuous and disconnected mini-busbar electrodes.
Figure 17B:
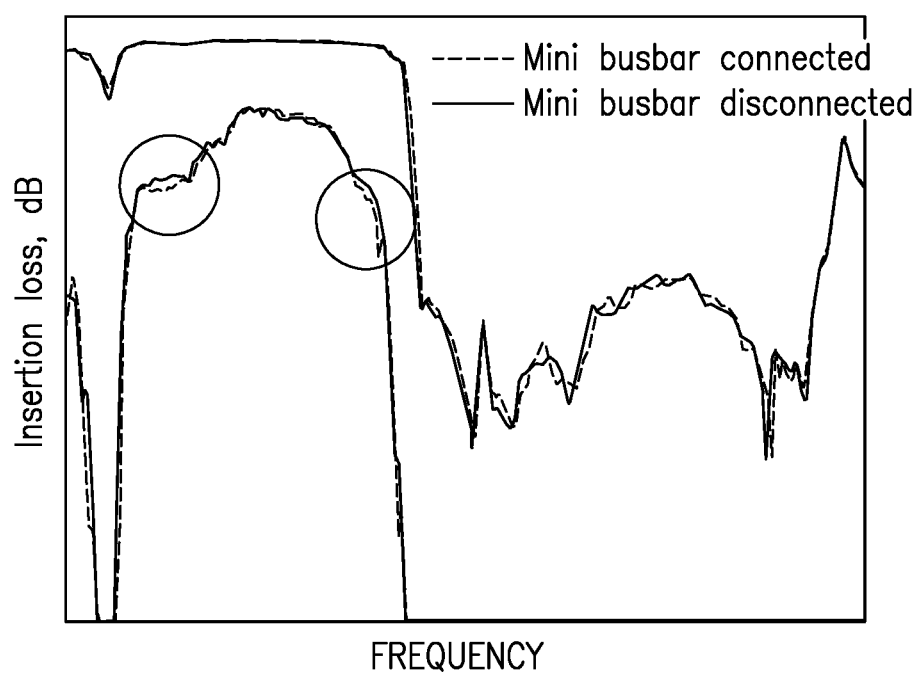
FIG. 17B is a chart of insertion loss versus frequency for ladder filters formed of acoustic wave resonators including continuous and unconnected mini-busbar electrodes.

Experiments were performed to determine the effect of introducing disconnects in the mini-busbars of the resonator structure of FIGS. 4B and 4B. FIG. 16 is a plan view of such a portion of a surface acoustic wave resonator having disconnected mini-busbars. Curves of real admittance for the resonator structure of FIGS. 4B and 4B with connected (also referred to herein as "continuous") and disconnected mini-busbars are illustrated in the chart of FIG. 17A. From this chart it can be seen that introducing disconnects into the mini-busbars suppresses some spurious signals associated with higher order transverse acoustic wave modes. Ladder filters were formed from the resonator structure of FIGS. 4B and 4B with connected and with disconnected mini-busbars. Measurements of the insertion loss versus frequency of these filters were performed. The results of these measurements are shown in FIG. 17B. It can bee seen that in the filter formed from the resonators with the disconnected mini-busbars, insertion loss was improved at both higher and lower ends of the passband as compared to the filter formed of the resonators with the connected mini-busbars.

Figure 18A:
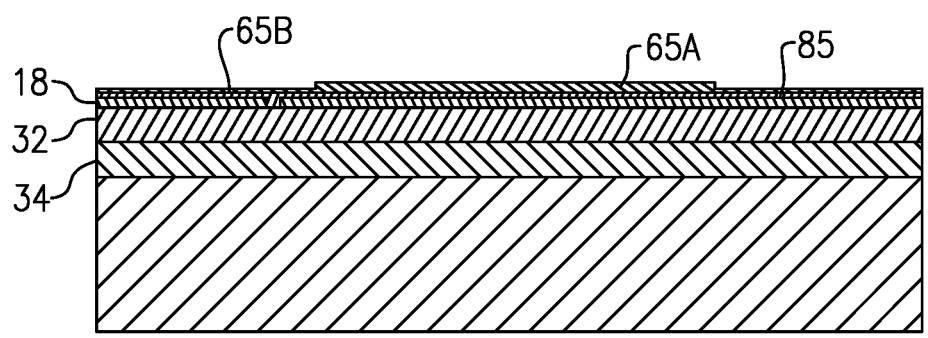
FIG. 18A is a cross-sectional view of a portion of another surface acoustic wave resonator.
Figure 18B:
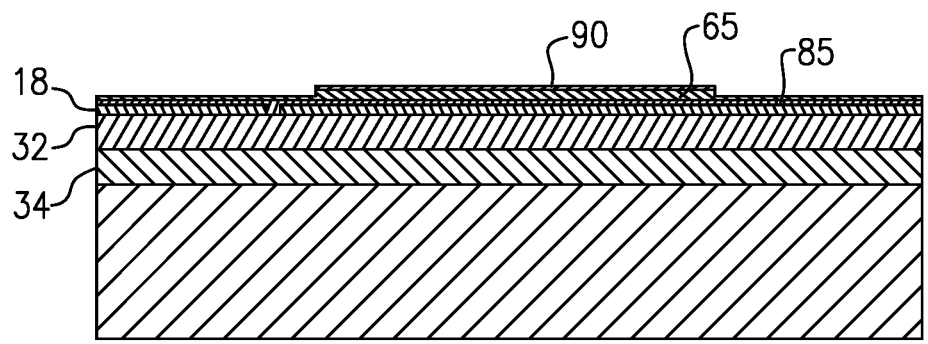
FIG. 18B is a cross-sectional view of a portion of another surface acoustic wave resonator.

Various other modifications may be made to the surface acoustic wave resonator structures disclosed herein. In surface acoustic wave resonator structures including a layer of silicon nitride disposed on the central interleaved region as illustrated in FIGS. 4A and 4B as well as surface acoustic wave resonator structures including a layer of silicon nitride disposed on the central interleaved region and a thinner layer of silicon nitride disposed in the gap and tip regions and/or a layer of silicon nitride disposed on the busbar electrodes as illustrated in FIGS. 6A and 6B, a layer of silicon dioxide 85 having a thickness of, for example, from 20 nm to 100 nm may be disposed between the IDT electrodes and piezoelectric substrate and the silicon nitride layer(s), for example, as illustrated in FIG. 18A. Additionally or alternatively a layer of silicon oxynitride 90 having a thickness of, for example, from 5 nm to 50 nm may be disposed over the silicon nitride layer(s), for example, as illustrated in FIG. 18B. The SiO2 or SiON layers may help avoid a shift in operating frequency of the resonator due to oxidation during later processing steps.

Figure 19:
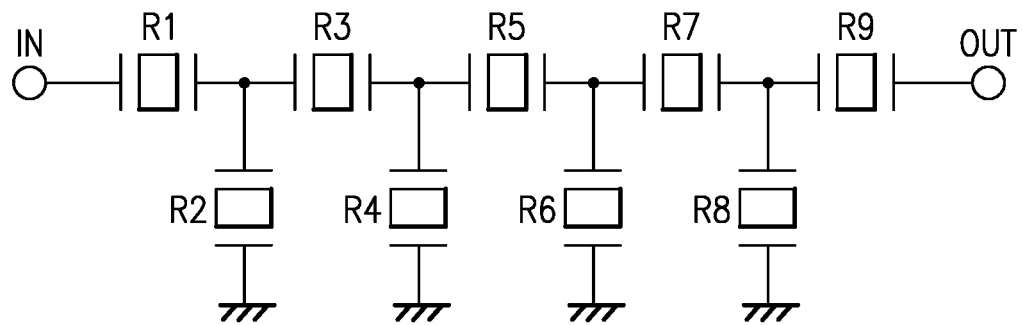
FIG. 19 is a schematic diagram of a radio frequency ladder filter.

In some embodiments, multiple SAW resonators as disclosed herein may be combined into a filter, for example, an RF ladder filter schematically illustrated in FIG. 19 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include SAW devices or resonators, for example, duplexers, baluns, etc., may also be formed including examples of SAW resonators as disclosed herein.

Figure 20:
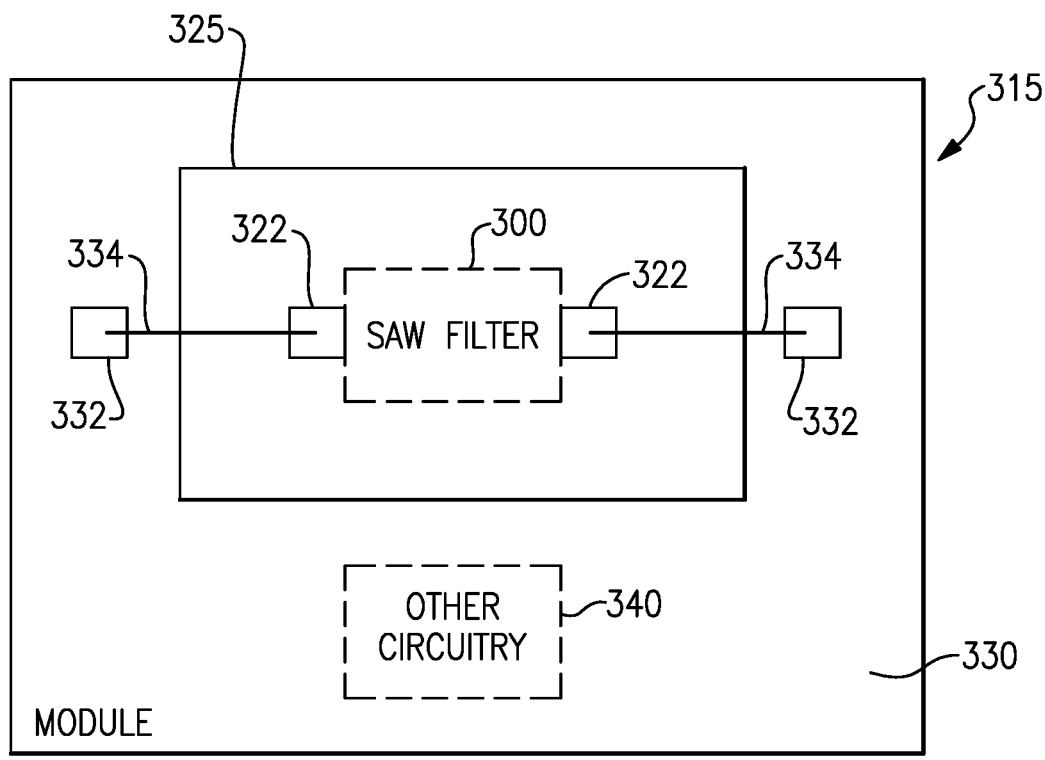
FIG. 20 is a block diagram of one example of a filter module that can include one or more acoustic wave elements according to aspects of the present disclosure.
Figure 21:
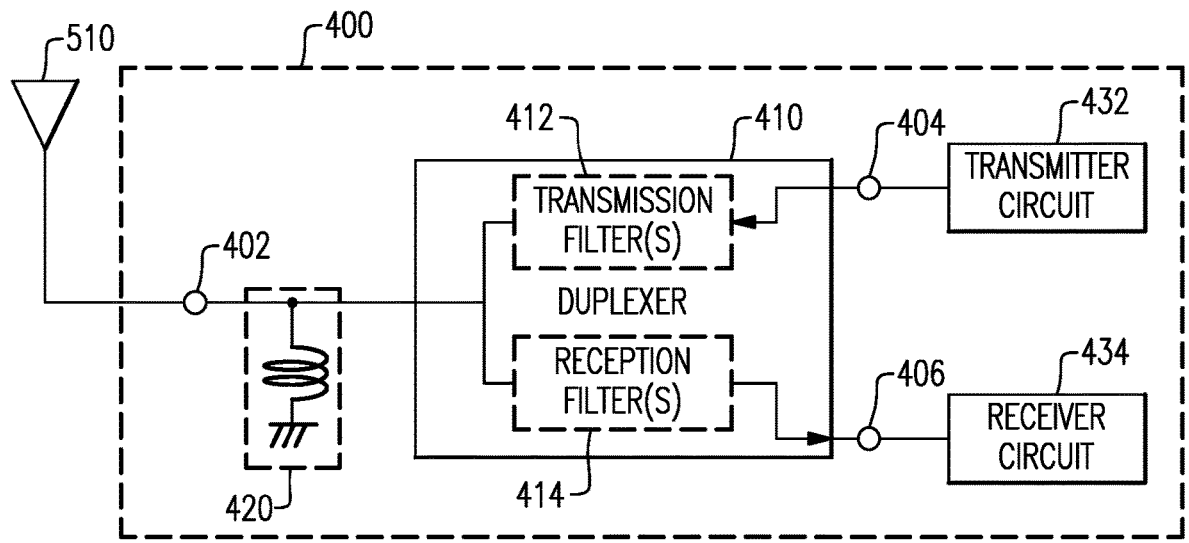
FIG. 21 is a block diagram of one example of a front-end module that can include one or more filter modules according to aspects of the present disclosure.
Figure 22:
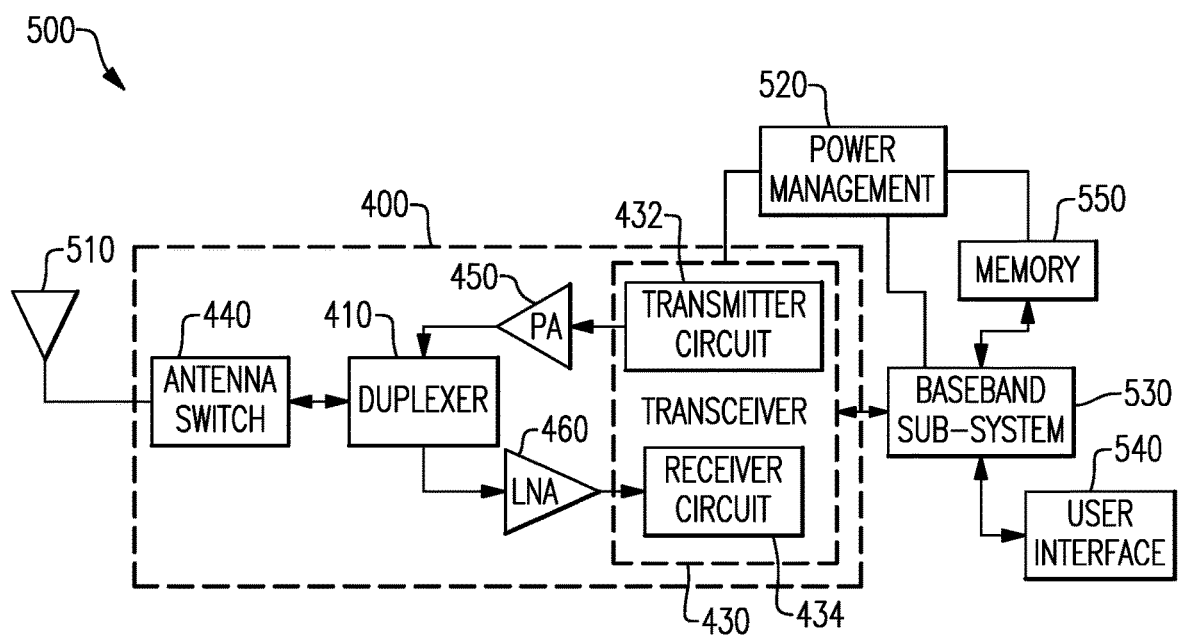
FIG. 22 is a block diagram of one example of a wireless device including the front-end module of FIG. 21.

Examples of the SAW devices, e.g., SAW resonators discussed herein can be implemented in a variety of packaged modules. Some example packaged modules will now be discussed in which any suitable principles and advantages of the SAW devices discussed herein can be implemented. FIGS. 20, 21, and 22 are schematic block diagrams of illustrative packaged modules and devices according to certain embodiments.

As discussed above, surface acoustic wave resonators can be used in surface acoustic wave (SAW) RF filters. In turn, a SAW RF filter using one or more surface acoustic wave elements may be incorporated into and packaged as a module that may ultimately be used in an electronic device, such as a wireless communications device, for example. FIG. 20 is a block diagram illustrating one example of a module 315 including a SAW filter 300. The SAW filter 300 may be implemented on one or more die(s) 325 including one or more connection pads 322. For example, the SAW filter 300 may include a connection pad 322 that corresponds to an input contact for the SAW filter and another connection pad 322 that corresponds to an output contact for the SAW filter. The packaged module 315 includes a packaging substrate 330 that is configured to receive a plurality of components, including the die 325. A plurality of connection pads 332 can be disposed on the packaging substrate 330, and the various connection pads 322 of the SAW filter die 325 can be connected to the connection pads 332 on the packaging substrate 330 via electrical connectors 334, which can be solder bumps or wirebonds, for example, to allow for passing of various signals to and from the SAW filter 300. The module 315 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 315 can also include one or more packaging structures to, for example, provide protection and facilitate easier handling of the module 315. Such a packaging structure can include an overmold formed over the packaging substrate 330 and dimensioned to substantially encapsulate the various circuits and components thereon.

Various examples and embodiments of the SAW filter 300 can be used in a wide variety of electronic devices. For example, the SAW filter 300 can be used in an antenna duplexer, which itself can be incorporated into a variety of electronic devices, such as RF front-end modules and communication devices.

Referring to FIG. 21, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 300 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 21, however, in other embodiments these components may be integrated into a common transceiver circuit or module. As will be appreciated by those skilled in the art, the front-end module 400 may include other components that are not illustrated in FIG. 21 including, but not limited to, switches, electromagnetic couplers, amplifiers, processors, and the like.

FIG. 22 is a block diagram of one example of a wireless device 500 including the antenna duplexer 410 shown in FIG. 21. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 21. The front-end module 400 includes the duplexer 410, as discussed above. In the example shown in FIG. 22 the front-end module 400 further includes an antenna switch 440, which can be configured to switch between different frequency bands or modes, such as transmit and receive modes, for example. In the example illustrated in FIG. 22, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 22.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 22, the front-end module 400 may further include a low noise amplifier module 460, which amplifies received signals from the antenna 510 and provides the amplified signals to the receiver circuit 434 of the transceiver 430.

The wireless device 500 of FIG. 22 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave resonator comprising:
a multi-layer piezoelectric substrate including a carrier substrate, a layer of a first dielectric material disposed on the carrier substrate, and a layer of piezoelectric material disposed on the layer of the first dielectric material;
interdigital transducer electrodes disposed on the layer of piezoelectric material and including interleaved electrode fingers;
a layer of a second dielectric material disposed on a central interleaved region of the interleaved electrode fingers, gap regions of the interdigital transducer electrodes being either free of the layer of the second dielectric material or having a thinner layer of the second dielectric material than the central interleaved region to reduce spurious signals in an admittance curve of the surface acoustic wave resonator; and
a layer of the first dielectric material disposed between the interdigital transducer electrodes and the layer of the second dielectric material.

2. The surface acoustic wave resonator of claim 1 wherein the first dielectric material comprises silicon dioxide.

3. The surface acoustic wave resonator of claim 2 wherein the second dielectric material exhibits a higher acoustic velocity than the first dielectric material.

4. The surface acoustic wave resonator of claim 2 wherein the second dielectric material comprises silicon nitride.

5. The surface acoustic wave resonator of claim 1 wherein the interleaved electrode fingers include tip regions that are free of the layer of the second dielectric material.

6. The surface acoustic wave resonator of claim 1 wherein the interleaved electrode fingers include tip regions, and both the gap regions and the tip regions have the thinner layer of the second dielectric material disposed thereon.

7. The surface acoustic wave resonator of claim 6 wherein the interdigital transducer electrodes include busbars that are covered by one of the layer of the second dielectric material or the thinner layer of the second dielectric material.

8. The surface acoustic wave resonator of claim 1 wherein the interdigital transducer electrodes include mini-busbar electrodes disposed within the gap regions.

9. The surface acoustic wave resonator of claim 8 wherein the mini-busbar electrodes extend continuously across a plurality of electrode fingers.

10. The surface acoustic wave resonator of claim 8 wherein the mini-busbar electrodes are broken into a plurality of segments, each of the plurality of segments connected to a single electrode finger.

11. The surface acoustic wave resonator of claim 1 wherein the interleaved electrode fingers include tip regions having a greater duty factor than a duty factor of the interleaved electrode fingers within the central interleaved region.

12. The surface acoustic wave resonator of claim 1 wherein the layer of the second dielectric material disposed on the central interleaved region of the interleaved electrode fingers has a thickness of about 0.01 $\lambda$.

13. The surface acoustic wave resonator of claim 1 wherein the interdigital transducer electrodes include dummy electrode fingers disposed within the gap regions.

14. The surface acoustic wave resonator of claim 1 wherein the interleaved electrode fingers have a duty factor greater than 0.5.

15. The surface acoustic wave resonator of claim 1 further comprising a layer of a third dielectric material disposed on a top of the layer of the second dielectric material, the third dielectric material being different from the first dielectric material and from the second dielectric material.

16. A filter including the surface acoustic wave resonator of claim 1.

17. A radio frequency device module including the filter of claim 16.

18. A radio frequency device including the radio frequency device module of claim 17.

19. A surface acoustic wave resonator comprising:
   a multi-layer piezoelectric substrate including a carrier substrate, a layer of a first dielectric material disposed on the carrier substrate, and a layer of piezoelectric material disposed on the layer of the first dielectric material;
   interdigital transducer electrodes disposed on the layer of piezoelectric material and including interleaved electrode fingers;
   a layer of a second dielectric material disposed on a central interleaved region of the interleaved electrode fingers, gap regions of the interdigital transducer electrodes being either free of the layer of the second dielectric material or having a thinner layer of the second dielectric material than the central interleaved region to reduce spurious signals in an admittance curve of the surface acoustic wave resonator; and
   a layer of a third dielectric material disposed on a top of the layer of the second dielectric material, the third dielectric material being different from the first dielectric material and from the second dielectric material.

20. A method of forming a surface acoustic wave resonator, the method comprising:
   forming interdigital transducer electrodes on a multi-layer piezoelectric substrate including a carrier substrate, a layer of a first dielectric material disposed on a front side of the carrier substrate, and a layer of piezoelectric material disposed on a front side of the layer of the first dielectric material;
   forming a layer of a second dielectric material on a central interleaved region of the interdigital transducer electrodes, gap regions of the interdigital transducer electrodes being either free of the layer of the second dielectric material or having a thinner layer of the second dielectric material than the central interleaved region to reduce spurious signals in an admittance curve of the surface acoustic wave resonator; and
   forming a layer of the first dielectric material between the interdigital transducer electrodes and the layer of the second dielectric material.

21. The method of claim 20 further comprising forming a radio frequency filter including the surface acoustic wave resonator of claim 20.

22. The method of claim 21 further comprising forming a radio frequency device module including the radio frequency filter of claim 21.

23. The method of claim 22 further comprising forming a radio frequency electronic device including the radio frequency device module of claim 22.

* * * * *